US009099477B2

(12) United States Patent
Morimoto

(10) Patent No.: US 9,099,477 B2
(45) Date of Patent: Aug. 4, 2015

(54) THREE-DIMENSIONAL INTEGRATED CIRCUIT HAVING STABILIZATION STRUCTURE FOR POWER SUPPLY VOLTAGE, AND METHOD FOR MANUFACTURING SAME

(71) Applicant: PANASONIC INTELLECTUAL PROPERTY MANAGEMENT CO., LTD., Osaka (JP)

(72) Inventor: Takashi Morimoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/232,024

(22) PCT Filed: Apr. 10, 2013

(86) PCT No.: PCT/JP2013/002446
§ 371 (c)(1),
(2) Date: Jan. 10, 2014

(87) PCT Pub. No.: WO2013/168354
PCT Pub. Date: Nov. 14, 2013

(65) Prior Publication Data
US 2014/0151882 A1    Jun. 5, 2014

(30) Foreign Application Priority Data

May 10, 2012  (JP) ................. 2012-108637

(51) Int. Cl.
*H01L 23/52*    (2006.01)
*H01L 23/538*   (2006.01)
(Continued)

(52) U.S. Cl.
CPC ........ *H01L 23/5386* (2013.01); *H01L 21/8221* (2013.01); *H01L 23/5223* (2013.01);
(Continued)

(58) Field of Classification Search
CPC ................. H01L 21/67138; H01L 21/823475; H01L 23/5223; H01L 23/538; H01L 23/5386; H01L 23/5222; H01L 23/66
USPC .................. 257/686, 691, 698, 723; 438/109
See application file for complete search history.

(56) References Cited

U.S. PATENT DOCUMENTS

2007/0001298 A1   1/2007  Ozawa et al.
2007/0102820 A1   5/2007  Kimura
(Continued)

FOREIGN PATENT DOCUMENTS

JP        2-32559      2/1990
JP     2002-124636    4/2002
(Continued)

OTHER PUBLICATIONS

International Preliminary Report on Patentability Issued Nov. 11, 2014 in International Application No. PCT/JP2013/002446.
(Continued)

*Primary Examiner* — Jarrett Stark
*Assistant Examiner* — Shahed Ahmed
(74) *Attorney, Agent, or Firm* — Wenderoth, Lind & Ponack, L.L.P.

(57) ABSTRACT

The three-dimensional integrated circuit has a first semiconductor chip and a second semiconductor chip stacked on the first semiconductor chip, wherein each of the first semiconductor chip and the second semiconductor chip is provided with a power supply wiring layer which has a wiring pattern structure for stably supplying a power supply voltage to an internal circuit of the semiconductor chip, and a ground wiring layer in succession, and one of the first semiconductor chip and the second semiconductor chip further includes a second ground wiring layer or a second power supply wiring layer on a surface facing to the other semiconductor chip.

16 Claims, 17 Drawing Sheets

(51) Int. Cl.
*H01L 49/02* (2006.01)
*H01L 23/522* (2006.01)
*H01L 23/528* (2006.01)
*H01L 21/822* (2006.01)
*H01L 27/06* (2006.01)
*H01L 25/00* (2006.01)
*H01L 25/065* (2006.01)
*H01L 23/64* (2006.01)

(52) U.S. Cl.
CPC .......... *H01L23/5286* (2013.01); *H01L 23/642* (2013.01); *H01L 25/0657* (2013.01); *H01L 25/50* (2013.01); *H01L 27/0688* (2013.01); *H01L 28/88* (2013.01); *H01L 2224/16225* (2013.01); *H01L 2225/06513* (2013.01); *H01L 2924/13091* (2013.01)

(56) References Cited

U.S. PATENT DOCUMENTS

| | | | |
|---|---|---|---|
| 2009/0020850 A1* | 1/2009 | Orita et al. | 257/532 |
| 2009/0237902 A1* | 9/2009 | Kouya | 361/777 |
| 2011/0057320 A1* | 3/2011 | Fujiyama et al. | 257/773 |
| 2012/0306101 A1* | 12/2012 | Tamaru | 257/774 |
| 2012/0327583 A1* | 12/2012 | Ayers et al. | 361/679.31 |
| 2014/0159041 A1* | 6/2014 | Yamaoka et al. | 257/48 |

FOREIGN PATENT DOCUMENTS

| | | |
|---|---|---|
| JP | 2002-270771 | 9/2002 |
| JP | 2005-223213 | 8/2005 |
| JP | 2005-244068 | 9/2005 |
| JP | 2007-134468 | 5/2007 |
| WO | 2005/122257 | 12/2005 |

OTHER PUBLICATIONS

International Search Report issued Jul. 9, 2013 in International (PCT) Application No. PCT/JP2013/002446.

Montrose, M., EMC Architecture of Printed Circuit Board, 1997, Chapter 3, pp. 53-76, cited in specification and English translation corresponds to CC.

Montrose, M., Printed Circuit Board Design Techniques for EMC Compliance, 1996, Chapter 3, pp. 47-68.

* cited by examiner

▦ POWER SUPPLY WIRING

◪ PAD (FOR DATA COMMUNICATION BETWEEN CHIPS)
☐ PAD (FOR POWER CONNECTING BETWEEN CHIPS)
■ PAD (FOR GRAND CONNECTING BETWEEN CHIPS)

THREE-DIMENSIONAL INTEGRATED CIRCUIT HAVING STABILIZATION STRUCTURE FOR POWER SUPPLY VOLTAGE, AND METHOD FOR MANUFACTURING SAME

BACKGROUND

1. Technical Field

The present disclosure relates to a power supply voltage stabilization technique for a three-dimensional integrated circuit which includes a plurality of stacked semiconductor chips.

2. Related Art

A circuit which is made of a plurality of semiconductor chips stacked and connected to each other by using TSVs (Through Silicon Vias), microbumps, and the like is called "three-dimensional integrated circuit". Since the three-dimensional integrated circuit has a plurality of semiconductor chips stacked, it has a shorter total wiring length and less power consumption per operation frequency than a circuit of a plane structure does. Therefore, the three-dimensional integrated circuit is a useful technique particularly for a general purpose processor of a high operation frequency and the like.

On the other hand, the three-dimensional integrated circuit has a risk of having the power supply voltage dropped in some semiconductor chips when load to the other semiconductor chips changes. Particularly in an advanced general purpose processor which consumes a high current, the power supply voltage tends to drop. Therefore, in ordinary cases, in order to stabilize the voltage applied to the load, a capacitor is installed on a substrate on which the three-dimensional integrated circuit is stacked so that the charge capacity of the capacitor compensates for the voltage drop. That kind of capacitor is called "decoupling capacitor".

The nearer to the load the capacitor is installed, the lower the inductor value is required for the wiring and the more the amount of charge is allowed to flow into the capacitor, therefore, the capacitor installed near to the load is effective as a decoupling capacitor (for example, see Chapter 3, "EMC architecture of printed circuit board" by Mark I. Montrose, published by Ohmsha Ltd.

Techniques of installing a decoupling capacitor near to the load are disclosed (for example, see Japanese Patent Laid-Open Publication No. 2005-244068). That semiconductor device is a stacked semiconductor device which has a plurality of semiconductor chips stacked and has a decoupling capacitor formed near to each of the semiconductor chips by having a film capacitor interposed between the chips.

However, the semiconductor device disclosed in Japanese Patent Laid-Open Publication No. 2005-244068 needs film capacitors and also requires an additional process step of interposing the film capacitor between the chips. Those factors increase the cost of the semiconductor device. Further, since the semiconductor device disclosed in Japanese Patent Laid-Open Publication No. 2005-244068 has additional contacts between each of the chips and the film as compared to the case where the chips are directly connected, the yield of the semiconductor device is deteriorated, which is another factor of increasing the cost.

On the other hand, techniques of reducing the cost by using wiring material in a semiconductor chip as an electrode of a capacitor are proposed. For example, there is a technique of forming a decoupling capacitor of high capacity by arranging metal wiring layers of the semiconductor chips, which are to be stacked, opposite to each other and bonding the semiconductor chips by an adhesive made of high dielectric material (for example, see WO 2005-122257).

However, since the method disclosed in WO 2005-122257 forms a capacitor of high capacity by having a high dielectric film between the semiconductor chips, the method needs materials and process steps different from those needed in ordinary three-dimensional stacking. Also, since an ordinary signal line is also arranged between the semiconductor chips in addition to a power supply and a ground in the three-dimensional integrated circuit, the arrangement of the high dielectric film increases a parasitic capacitance of the signal line between the semiconductor chips, which results in a greater signal delay.

SUMMARY

The present disclosure is adapted in view of the above described problems and an object of the present disclosure is to provide a three-dimensional integrated circuit which has a decoupling capacitor of high capacity formed near to a semiconductor chip only by ordinary semiconductor fabrication process steps, and a fabrication method of the three-dimensional integrated circuit.

In one general aspect, the techniques disclosed here feature: a three-dimensional integrated circuit includes:
- a first semiconductor chip; and
- a second semiconductor chip stacked on the first semiconductor chip,
- wherein each of the first semiconductor chip and the second semiconductor chip is provided with a power supply wiring layer which has a wiring pattern structure for stably supplying a power supply voltage to an internal circuit of the semiconductor chip, and a ground wiring layer in succession, and
- one of the first semiconductor chip and the second semiconductor chip further includes a second ground wiring layer or a second power supply wiring layer on a surface facing to the other semiconductor chip.

The three-dimensional integrated circuit according to the present disclosure can realize forming of decoupling capacitors each of which includes a pair of a power supply wiring layer and a ground wiring layer in a first semiconductor chip and a second semiconductor chip more than those formed in ordinary three-dimensional integrated circuit fabrication by adding wiring process steps of forming a second ground wiring layer or a second power supply wiring layer between two semiconductor chips to ordinary three-dimensional integrated circuit fabrication. The decoupling capacitor of the above described configuration formed in the semiconductor chip covers a power supply voltage drop and can stabilize the voltage supplied to the semiconductor chip. Further, since a surface layer may be rewired to be used in three-dimensional integration, the three-dimensional integrated circuit according to the present disclosure is advantageous in that it can form the decoupling capacitor concurrently with the rewiring.

BRIEF DESCRIPTION OF DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1:
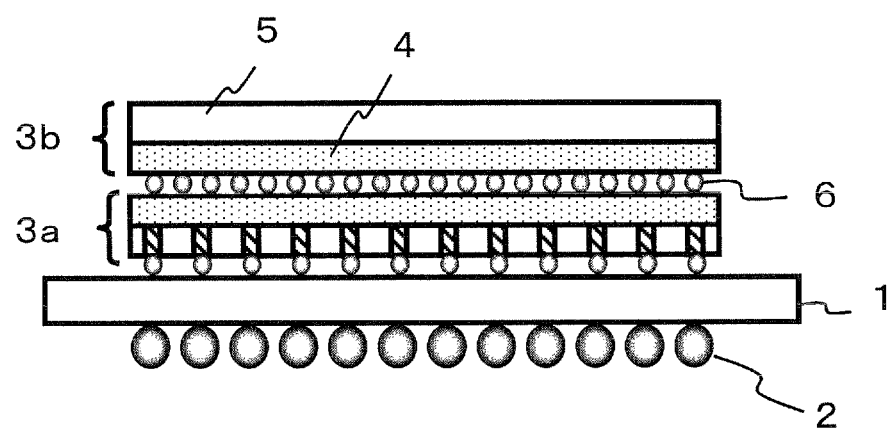
FIG. 1 is a cross-sectional view illustrating a cross-sectional composition of a three-dimensional integrated circuit which has two chips and a package substrate stacked.

According to a first aspect, a three-dimensional integrated circuit includes:

a first semiconductor chip; and
a second semiconductor chip stacked on the first semiconductor chip,
wherein each of the first semiconductor chip and the second semiconductor chip is provided with a power supply wiring layer which has a wiring pattern structure for stably supplying a power supply voltage to an internal circuit of the semiconductor chip, and a ground wiring layer in succession, and
one of the first semiconductor chip and the second semiconductor chip further includes a second ground wiring layer or a second power supply wiring layer on a surface facing to the other semiconductor chip.

As a result, the three-dimensional integrated circuit according to the first aspect of the present disclosure can realize forming of decoupling capacitors each of which includes a pair of a power supply wiring layer and a ground wiring layer in a first semiconductor chip and a second semiconductor chip more than those formed in ordinary three-dimensional integrated circuit fabrication by adding wiring process steps of forming a second ground wiring layer or a second power supply wiring layer between two semiconductor chips to the ordinary three-dimensional integrated circuit fabrication. The decoupling capacitor of the above described configuration formed in the semiconductor chip covers a power supply voltage drop and can stabilize the voltage supplied to the semiconductor chip. Further, since a surface layer may be rewired to be used in three-dimensional integration, the three-dimensional integrated circuit according to the first aspect of the present disclosure is advantageous in that it can form the decoupling capacitor concurrently with the rewiring.

Further, as a three-dimensional integrated circuit of a second aspect, in the first aspect, the three-dimensional integrated circuit may further include a decoupling capacitor formed between the second ground wiring layer or the second power supply wiring layer and the power supply wiring layer or the ground wiring layer of the other semiconductor chip.

Further, as a three-dimensional integrated circuit of a third aspect, in the first aspect, the three-dimensional integrated circuit may further include a decoupling capacitor formed between the power supply wiring layer and the ground wiring layer in each of the first semiconductor chip and the second semiconductor chip.

Further, as a three-dimensional integrated circuit of a fourth aspect, in the first aspect, the power supply wiring layer and the ground wiring layer may be provided on a surface facing the opposite semiconductor chip in each of the first semiconductor chip and the second semiconductor chip.

Both of the power supply wiring layers and the ground wiring layers may be formed within two layers from the surfaces of the respective semiconductor chips. According to the configuration, the three-dimensional integrated circuit according to the fourth aspect is advantageous in that it can form a decoupling capacitor of high capacity, since the power supply wiring layer and the ground wiring layer are opposite to each other in each of the first semiconductor chip and the second semiconductor chip so that a pair of the power supply wiring layer and the ground wiring layer is formed in each semiconductor chip.

Further, as a three-dimensional integrated circuit of a fifth aspect, in the first aspect, the one of the first semiconductor chip and the second semiconductor chip may have the power supply wiring layer or the ground wiring layer immediately under the second ground wiring layer or the second power supply wiring layer, and the one of the first semiconductor chip and the second semiconductor chip may have a decoupling capacitor formed between the second ground wiring layer or the second power supply wiring layer and the power supply wiring layer or the ground wiring layer immediately under the second ground wiring layer or the second power supply wiring layer.

That is, the three-dimensional integrated circuit according to the fifth aspect may include the second ground wiring layer or the second power supply wiring layer, which is added to the top of either the first semiconductor chip or the second semiconductor chip, and the power supply wiring layer or the ground wiring layer immediately under the second ground wiring layer or the second power supply wiring layer. According to the configuration, the three-dimensional integrated circuit according to the fifth aspect is advantageous in that it can form a large capacity, since it has a structure to enable most of the respective wiring layers on the uppermost layers of the first semiconductor chip and the second semiconductor chip of an identical pattern to face the newly added second ground wiring layer or the newly added second power supply wiring layer, and therefore, enables a decoupling capacitor of much higher capacity to be formed by the first semiconductor chip, the second semiconductor chip, and the added wiring layers.

Further, as a three-dimensional integrated circuit of a sixth aspect, in the first aspect, the circuit includes four pairs of the power supply wiring layer and the ground wiring layer which are opposite to each other or the ground wiring layer and the power supply wiring layer which are opposite to each other.

Both of the power supply wiring layers and the ground wiring layers may be formed within two layers from the surfaces of the respective semiconductor chips. Further, a new second ground wiring layer or a new second power supply wiring layer may be formed between these wiring layers. Therefore, the power supply wiring layer and the ground wiring layer may be alternately arranged in the three-dimensional integrated circuit. According to the configuration, the power supply wiring layer and ground wiring layer are opposite to each other in each of the first semiconductor chip and the second semiconductor chip. Further, the newly added second ground wiring layer or the newly added second power supply wiring layer faces the ground wiring layer or the power supply wiring layer on each surface of these semiconductor chips. As a result, the three-dimensional integrated circuit according to the sixth aspect is advantageous in that it can form a decoupling capacitor of high capacity, since it can form four pairs of the power supply wiring layers and the ground wiring layers.

Further, as a three-dimensional integrated circuit of a seventh aspect, in the first aspect, the wiring pattern structure of the power supply wiring layer may include mesh-like metal wiring.

According to the configuration, respective areas covered by the power supply wiring layers and the ground wiring layers increase in the first semiconductor chip and the second semiconductor chip. As a result, since the area of a surface at which the power supply wiring layers and the ground wiring layers face each other increase, the capacities of the decoupling capacitors increase. Accordingly, the three-dimensional integrated circuit according to the seventh aspect has an advantage of stabilizing the power supply to each of the chips.

Further, as a three-dimensional integrated circuit of a eighth aspect, in the first aspect, the wiring pattern structure of the power supply wiring layer may include a power supply ring which encloses the wiring pattern structure and a strap which vertically or horizontally connects an inner surface of the power supply ring.

According to the configuration, respective areas covered by the power supply wiring layers and the ground wiring layers increase in the first semiconductor chip and the second semiconductor chip. As a result, since the area of a surface at which the power supply wiring layers and the ground wiring layers face each other increase, the capacities of the decoupling capacitors increase. Accordingly, the three-dimensional integrated circuit according to the seventh aspect has an advantage of stabilizing the power supply to each of the chips.

Further, as a three-dimensional integrated circuit of a ninth aspect, in the first aspect, the first semiconductor chip and the second semiconductor chip have same transistor layers.

According to the configuration, since both of a product which is used as a single semiconductor chip without being stacked and a product which is used as one of a plurality of three-dimensionally stacked semiconductor chips can be fabricated by using a mask of an identical layout, the cost can be reduced. Here, the term "identical" applies to the transistor layer, i.e., only the transistor layers need to be identical. In other words, the semiconductor chips may have different TSVs and wiring layers. Conversely, not only the transistor layers but the whole of the semiconductor chips except for the additionally provided second ground wiring layers or the additionally provided second power supply wiring layers may be identical. Alternatively, one of the masks for the semiconductor chips may be identical.

Further, as a three-dimensional integrated circuit of a tenth aspect, in the first aspect, the power supply wiring layer and the ground wiring layer may correspond to global wiring layers.

The global wiring layer is broader and, thus, can cover a wider area than that covered by the local wiring layer which is near to the transistor. As a result, the three-dimensional integrated circuit according to the tenth aspect has not only an advantage of decreasing the power supply resistance value by the broad wiring as the power supply stabilization but also an advantage of forming a high capacity as decoupling capacitors since the wiring layers are capable of having wide areas to face each other.

Further, as a three-dimensional integrated circuit of an eleventh aspect, in the first aspect, the circuit may further include a substrate supporting the whole of the three-dimensional integrated circuit.

Further, as a three-dimensional integrated circuit of a twelfth aspect, in the first aspect, the three-dimensional integrated circuit may further include a third semiconductor chip. The third semiconductor chip is stacked to the first semiconductor chip or the second semiconductor chip.

Further, as a three-dimensional integrated circuit of a thirteenth aspect, in the twelfth aspect, the third semiconductor chip may be provided between the substrate and the first semiconductor chip or the second semiconductor chip, and the three-dimensional integrated circuit may include the second ground wiring layer or the second power supply wiring layer between the first semiconductor chip and the second semiconductor chip which are far from the substrate.

That is, the configuration of forming the second ground wiring layer or the second power supply wiring layer may be provided between the first semiconductor chip and the second semiconductor chip which are far from the substrate. Conventionally, a processor chip which has a high calorific value is stacked on a part which is in contact with a heat sink, i.e., a part which is far from the substrate. Conversely, since the part is far from the decoupling capacitor on the substrate, it is difficult to keep stable power supply to the chip. Then, with the above described configuration applied, the three-dimensional integrated circuit according to the thirteenth aspect is advantageous in that it can form the decoupling capacitor for stably supplying the power at the place near to the semiconductor chip which is far from the substrate.

Further, as a three-dimensional integrated circuit of a fourteenth aspect, in the twelfth aspect, the first semiconductor chip or the second semiconductor chip may be provided to be in contact with the substrate, the third semiconductor chip may be provided on one of the first semiconductor chip and the second semiconductor chip which is not in contact with the substrate.

The first semiconductor chip or the second semiconductor chip which is provided to be in contact with the substrate may consume a higher current than the third semiconductor chip.

That is, the configuration of forming the second ground wiring layer or the second power supply wiring layer may be provided between the first semiconductor chip and the second semiconductor chip, one of which consumes high power. The three-dimensional integrated circuit according to the fourteenth aspect is advantageous in that it can effectively perform stable power supply, since it can form a decoupling capacitor of high capacity near to the chip which consumes high power.

According to a fifteenth aspect, a processor device may include the three-dimensional integrated circuit according to any one of the first to fourteenth aspects.

According to a sixteenth aspect, a fabrication method of a three-dimensional integrated circuit which has a first semiconductor chip and a second semiconductor chip stacked on the first semiconductor chip, the fabrication method includes:

forming a first semiconductor chip by stacking a transistor layer and a wiring layer which includes a ground wiring layer and a power supply wiring layer;

forming a second semiconductor chip by further stacking a second ground wiring layer or a second power supply wiring layer by using a part of the first semiconductor chip which is obtained in the step of forming the first semiconductor chip; and forming a three-dimensional integrated circuit by bonding a surface of the wiring layer of the first semiconductor chip with the second ground wiring layer or the second power supply wiring layer of the second semiconductor chip to be opposite to each other.

A three-dimensional integrated circuit according to an embodiment of the present disclosure will be described with reference to the accompanying drawings. Substantially identical parts are denoted by the same reference codes in the drawings.

<Configuration of a Three-Dimensional Integrated Circuit>

FIG. 1 is a cross-sectional view illustrating a cross-sectional composition of a three-dimensional integrated circuit 10 which has two semiconductor chips 3a and 3b and a package substrate 1 stacked. The two semiconductor chips of the first semiconductor chip 3a and the second semiconductor chip 3b are stacked, and further, a signal and a power supply are made transferred out from the backside of the first semiconductor chip 3a onto the package substrate 1 through a TSV (Through-Silicon Via). The three-dimensional integrated circuit 10 is finally rewired to bumps 2 for the board (not shown) through the package substrate 1, so that the three-dimensional integrated circuit 10 is configured to connect the signal to the board via the bumps 2.

The inside of each of the semiconductor chips 3a and 3b included in the three-dimensional integrated circuit 10 is largely divided into each of wiring layers 4a and 4b and a transistor layer 5. The wiring layers 4a and 4b are, as it might be understood without explanation, for wiring between transistors or between bumps, and is used as a signal line or a power line. In the transistor layer 5, elements such as MOS transistors as circuit elements, capacitative elements, resistance elements are arranged. Here, it is assumed that the three-dimensional integrated circuit 10 of FIG. 1 is configured to connect the wiring layer 4 of the first semiconductor chip 3a (face-to-face) with the wiring layer 4 of the second semiconductor chip 3b by using bumps (microbumps) 6 for connecting the chips.

Figure 2:
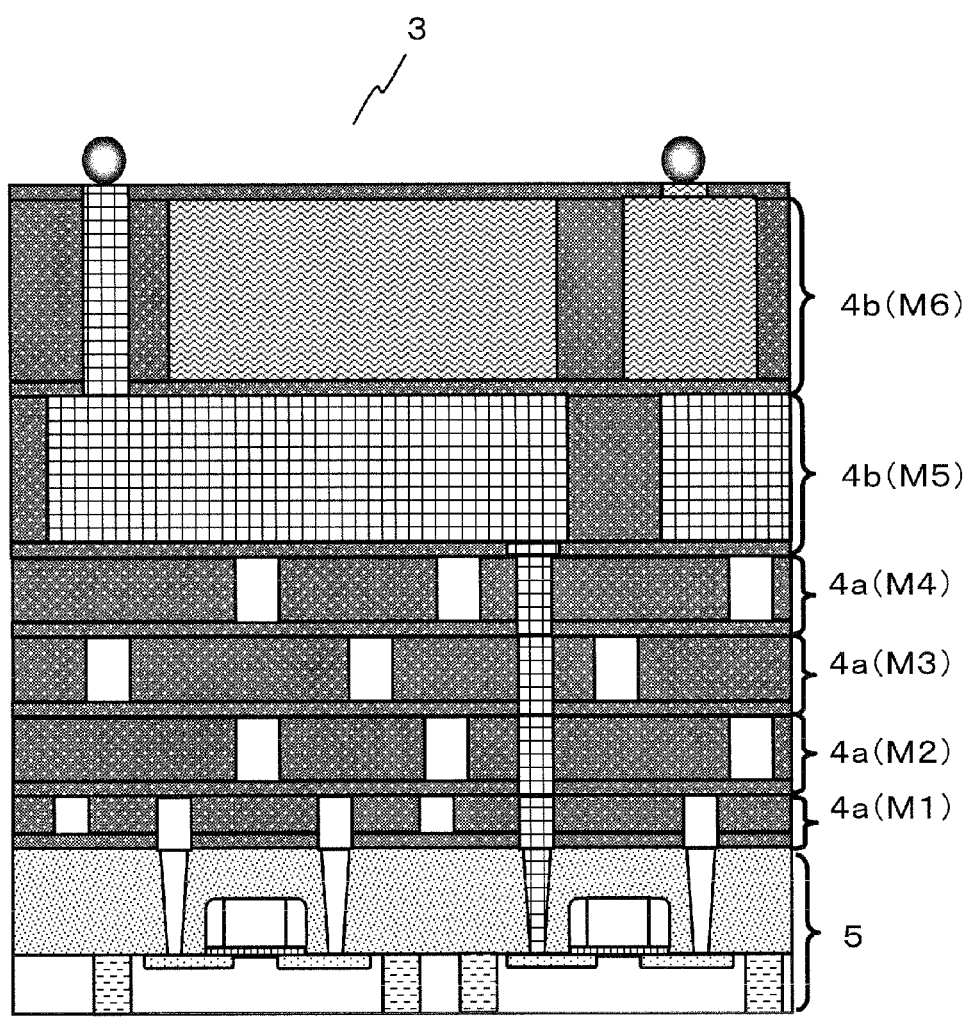
FIG. 2 is a cross-sectional view illustrating a cross-sectional structure of a semiconductor chip.

FIG. 2 is a cross-sectional view illustrating a cross-sectional structure of one of the semiconductor chips 3. The structure inside the first semiconductor chip 3a will be described in further detail with reference to FIG. 2. The transistor layer 5 includes a MOS (Metal Oxide Semiconductor) transistor which mainly consists of a shallow trench isolation (STI), a gate, a source, and a drain, and a contact hole. The TSV is formed to pass through a silicon substrate which supports the transistor layer 5; however, it is assumed here that the TSV is not included in the transistor layer 5. The TSV is not illustrated in FIG. 2. The plurality of wiring layers 4 (4a and 4b) are formed on the transistor layer 5. These wiring layers 4 (4a and 4b) have a function of supplying power supplies to the transistors and a function of connecting the respective transistors.

The wiring layers 4 include a local wiring layer 4a (M1) which is the nearest to the transistor and has a minimum wiring pitch, intermediate wiring layers 4a (M2 to M4) on the local wiring layer 4a (M1), and global wiring layers 4b (M5 to M6) on the intermediate wiring layers 4a (M2 to M4). The intermediate wiring layer 4a is also called an intermediate layer or a semi-global layer. Although the structure of six-layer wiring has been described as an example here, the semiconductor chip may have a wiring structure of about nine layers to twelve layers fabricated in 32 nm or 45 nm advanced CMOS process in an ordinary case. On the other hand, the semiconductor chip is not limited to the six-layer wiring and may have a wiring structure of three layers, four layers, and the like, for example. Meanwhile, global wiring is also called as wide range wiring (global wiring in Japanese). The global wiring sometimes means wide wiring having a wide width.

<Configuration of Power Supply in the Semiconductor Chip>

FIG. 2 is a cross-sectional view of the semiconductor chip 3, denoting a ground wiring layer 4b (Vss) by parts filled with wavy lines. FIG. 2 also denotes the power supply wiring layer 4b (Vdd) by parts filled with grid pattern. Here, the power supply mainly uses the M6 layer of the global wiring layer 4b and the ground mainly uses the M5 layer of the global wiring layer 4b. The three-dimensional integrated circuit 10 is required to have a wiring structure which is free from an IR drop even in the case where power consumption of a large scale circuit logic in the semiconductor chip 3 surges.

Figure 3A:
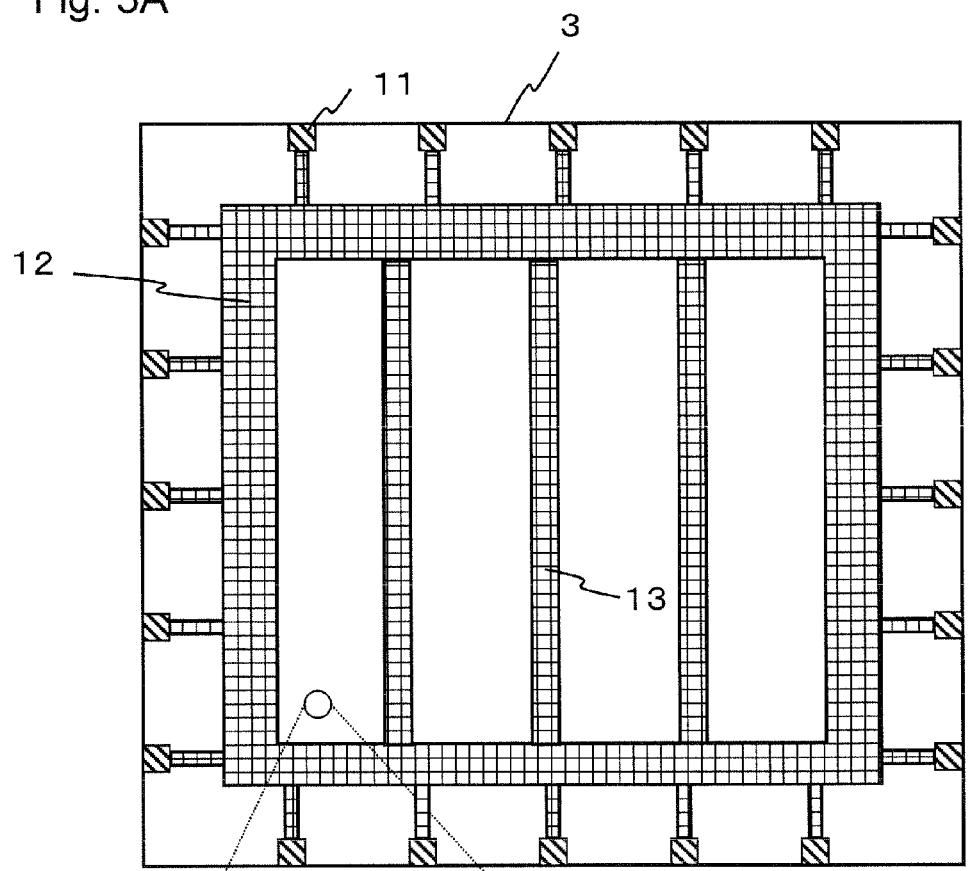
FIG. 3A is a plan view illustrating a wiring structure of a power supply wiring layer (M6) which has a power supply ring and straps.
Figure 3B:
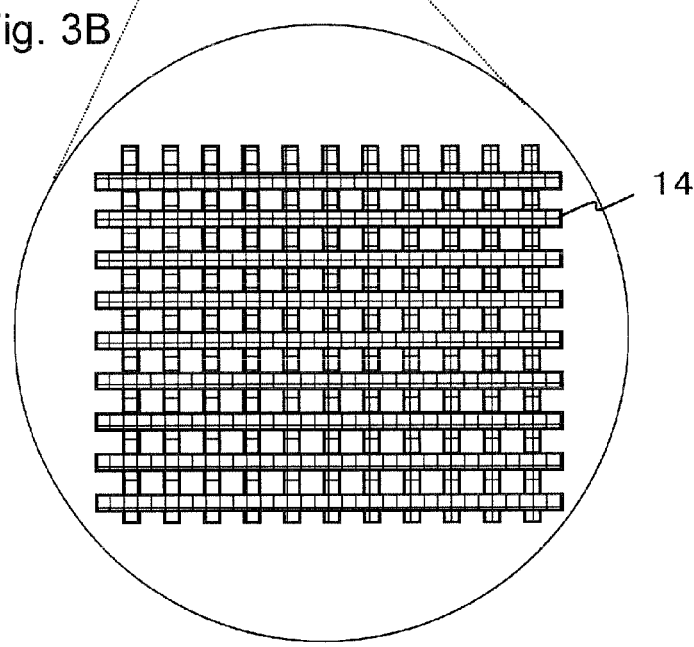
FIG. 3B is an enlarged view illustrating a structure of a power supply mesh in the power supply ring.

FIG. 3A is a plan view illustrating a wiring structure of a power supply wiring layer (M5) (Vdd) which has a power supply ring 12 and straps 13. FIG. 3B is an enlarged view illustrating a structure of a power supply mesh 14 in the power supply ring 12. FIG. 2 is a cross-sectional view of the semiconductor chip 3 in lateral direction, whereas FIG. 3 is a plan view of the semiconductor chip 3 seen from above only illustrating the wiring layer of the M5 layer except for 10 pads 11. The power supply (Vdd) supplied from the 10 pads 11 is connected to the power supply ring 12 which is made of wide metal lines encircling the circuit logic. The power supply ring 12 encircles slightly wide power supply lines called straps 13 which connect the power supply ring 12 in the longitudinal direction. The power supply mesh 14 of a mesh-like structure with fine wires as illustrated in the enlarged view of FIG. 3B is provided inside of the power supply ring 12, and Vdd is supplied to each circuit through the power supply mesh 14. According to the configuration, the semiconductor chip 3 can reduce the voltage drop due to wiring resistance anywhere in the power supply ring 12, and can stably supply power without causing the IR drop even in the case where a large current is locally consumed.

Although not illustrated in the figures, the ground wiring layer (4b (M6)) may be in the same wiring structure as that of the power supply wiring layer (4b (M5)).

Although the power supply wiring layer (Vdd) is formed only in the M5 layer in the examples of FIGS. 3A and 3B, the power supply wiring layer (Vdd) is not limited to that. For example, the power supply wiring layer (Vdd) may be divided such that a laterally extending wiring layer is formed in the M5 layer and a longitudinally extending wiring layer is formed in the M6 layer. In that case, the ground wiring layer (Vss) may be divided such that a laterally extending wiring layer is formed in the M5 layer and a longitudinally extending wiring layer is formed in the M6 layer. Like that, the power supply wiring layer (Vdd) and the ground wiring layer (Vss) may be wired in the same layers for the lateral direction and the longitudinal direction, respectively. In the case where the power supply wiring layer is wired to respective transistors, the wiring layers from M1 to M5 are used, but in the case where the power supply wiring layer is used for a mere contact to be connected to the power supply line of a standard cell, the other wiring layers from M1 to M4 need not to be included in that ring structure.

Figure 4A:
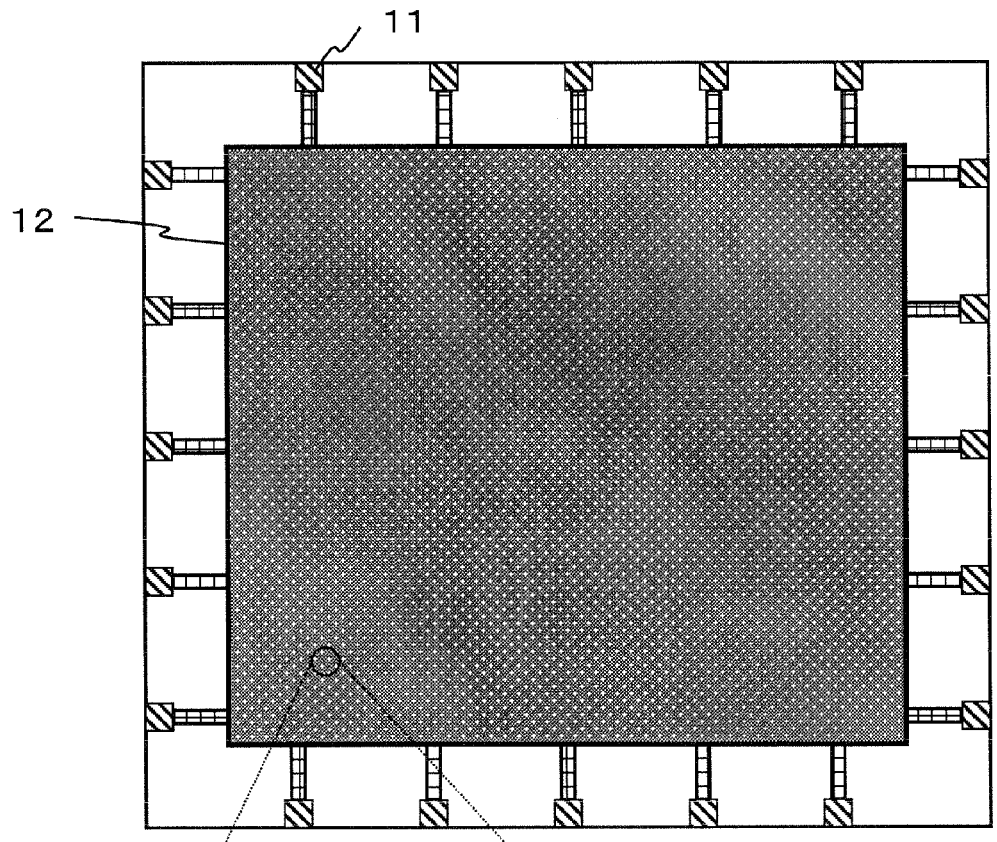
FIG. 4A is a plan view illustrating a structure of a power supply wiring layer (M6) only having a mesh structure of a power supply mesh.
Figure 4B:
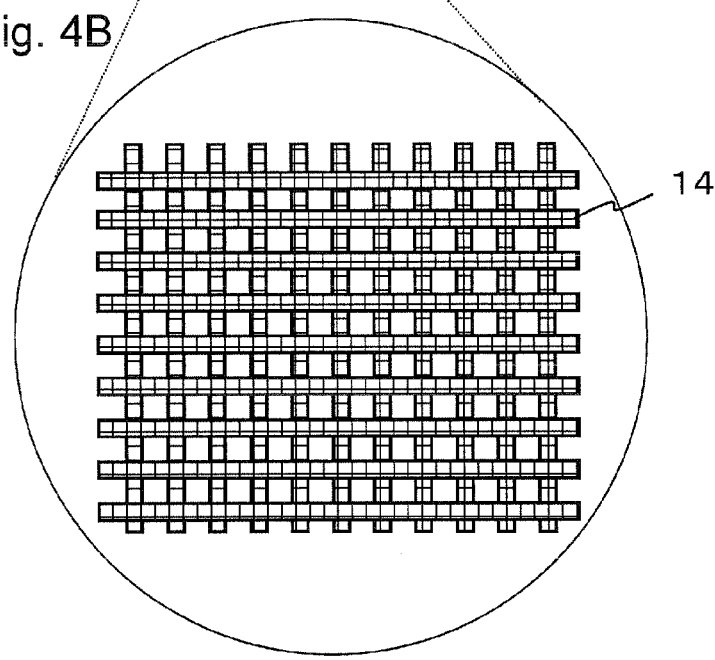
FIG. 4B is an enlarged view illustrating a structure of the power supply mesh.

FIG. 4A is a plan view illustrating a structure of a power supply wiring layer (M5 (Vdd)) only having a mesh structure of the power supply mesh 14. FIG. 4B is an enlarged view illustrating a structure of the power supply mesh 14. In the power supply wiring layer (M5(Vdd)), unlike in the above described power supply wiring layer which has the power supply ring 12 and the straps 13, the power supply is supplied solely by a mesh-like metal wiring 14 without the power supply ring and straps.

These power supply wiring layer 21 and ground wiring layer 22 are formed by using the upper wiring layers 4b (for example, M5 and M6) of the semiconductor chip 3. A signal line connecting the transistors is wired by using the wiring layer 4a as low as possible (for example, M1 to M4) so that the wiring length of the signal line is made short, and the global wiring layer is used only for a part of wiring used for communication or the like between blocks far from each other such as wiring between the circuit blocks.

<Problem in Bonding a plurality of Semiconductor Chips>

By orderly wiring the power supply wiring layer and the ground wiring layer by using global wiring as described above, the semiconductor chip is configured to stabilize the power supply. Since metal wiring of the power supply wiring layer 4b (M6) and metal wiring of the ground wiring layer 4b (M5) are arranged opposite to each other, the metal electrodes are opposite to each other and cause parasitic capacitance. The decoupling capacitor can be formed by using the parasitic capacitance.

A case where two semiconductor chips 3a and 3b which have identical layouts are bonded will be described as an example.

Figure 5:
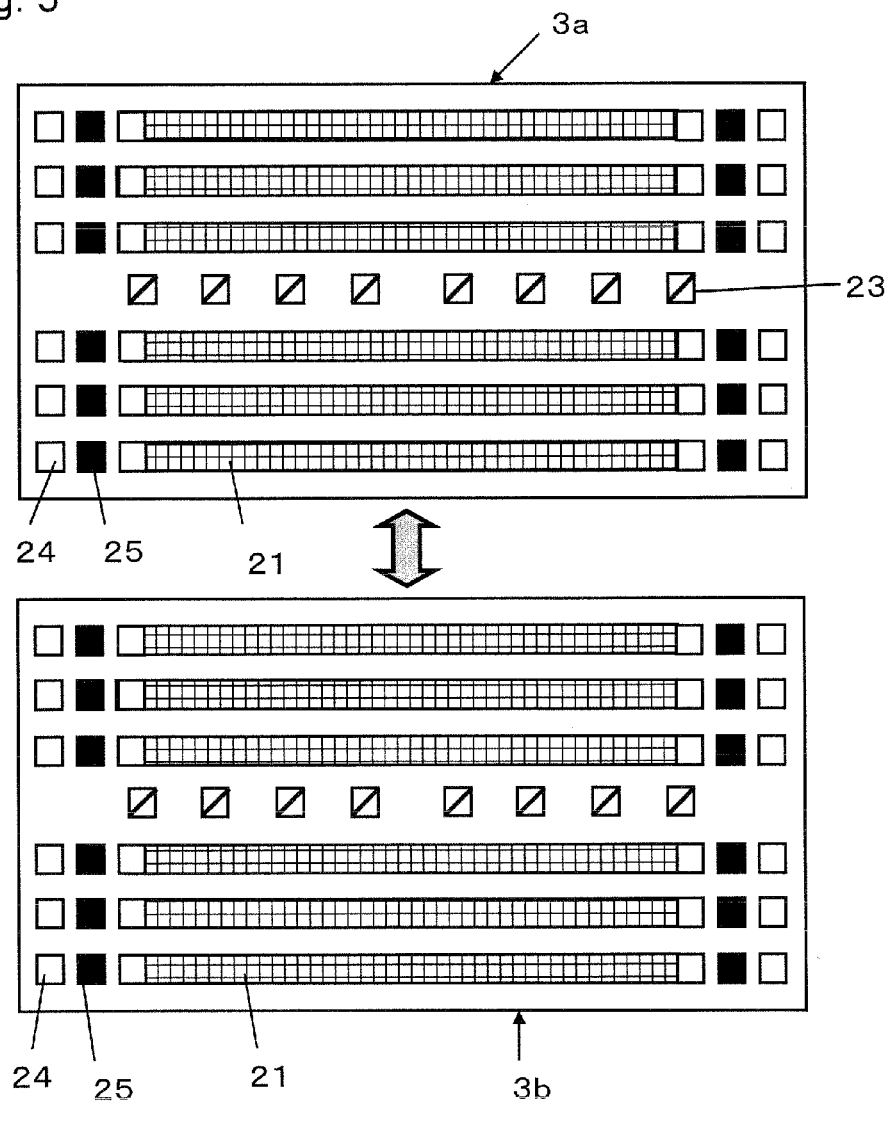
FIG. 5 is a plan view illustrating respective opposite surfaces of two semiconductor chips which have identical layouts in the case where the two semiconductor chips are bonded face-to-face.

FIG. 5 is a plan view illustrating respective opposite surfaces of the two semiconductor chips 3a and 3b which have identical layouts in the case where the two semiconductor chips 3a and 3b are bonded face-to-face. The uppermost wiring layer (M6) has a power supply related wiring layer 21 and respective types of pads 23, 24, and 25. The pads 23, 24, and 25 are parts serving as bases for forming the microbumps which connect the semiconductor chips 3a and 3b with the other semiconductor chips 3b and 3a. Here, the three-dimensional integrated circuit may have the wiring directly connected with the other wiring without using the microbumps.

A simplified wiring structure is used in this example for convenience of the description, though, a considerable number of fine wires are wired on the semiconductor chips 3a and 3b in practical cases.

The uppermost wiring layers are in the same configuration in the case where identical semiconductor chips are used. Therefore, as illustrated in FIG. 5, in three-dimensional stacking of the semiconductor chips using face-to-face integration, the integrated circuit has a structure of having the power supply wiring layer 21 face the power supply wiring layer 21. In that configuration, the decoupling capacitor is not formed on the metal wiring layers on the surfaces.

Figure 6:
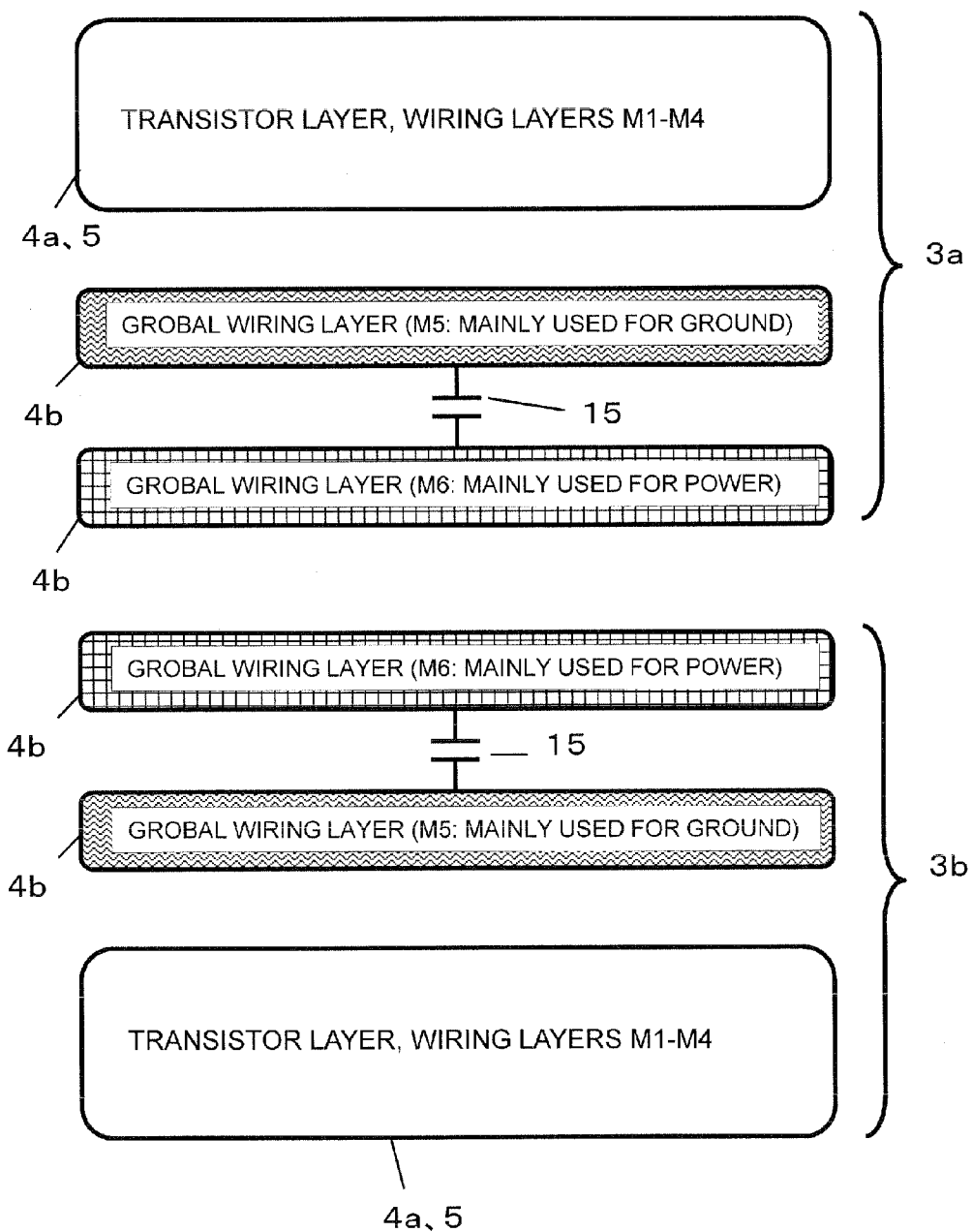
FIG. 6 is a schematic view illustrating a cross-sectional composition of a three-dimensional integrated circuit in the case where two semiconductor chips which have identical layouts are bonded face-to-face.

FIG. 6 is a schematic view illustrating a cross-sectional composition of a three-dimensional integrated circuit in the case where two semiconductor chips 3a and 3b which have identical layouts are bonded face-to-face. A capacity is formed in each of the semiconductor chips 3a and 3b as a result of pairing the wiring of the M5 layer used for the ground with the wiring of the M6 layer used for the power supply. However, since the power supply wiring layers 21 used for the power supply are facing each other between the semiconductor chips 3a and 3b, a capacity is not formed there.

The present inventor has found a problem in which the decoupling capacitors formed between the power supply wiring layers (M6) and the ground wiring layers (M5) in the respective semiconductor chips 3a and 3b in the three-dimensional integrated circuit 10 which has the two semiconductor chips 3a and 3b stacked are still insufficient to stabilize the power supply, and has sought to form a further decoupling capacitor, and has finally accomplished the present disclosure.

First Embodiment

Configuration of a Three-Dimensional Integrated Circuit

Figure 7:
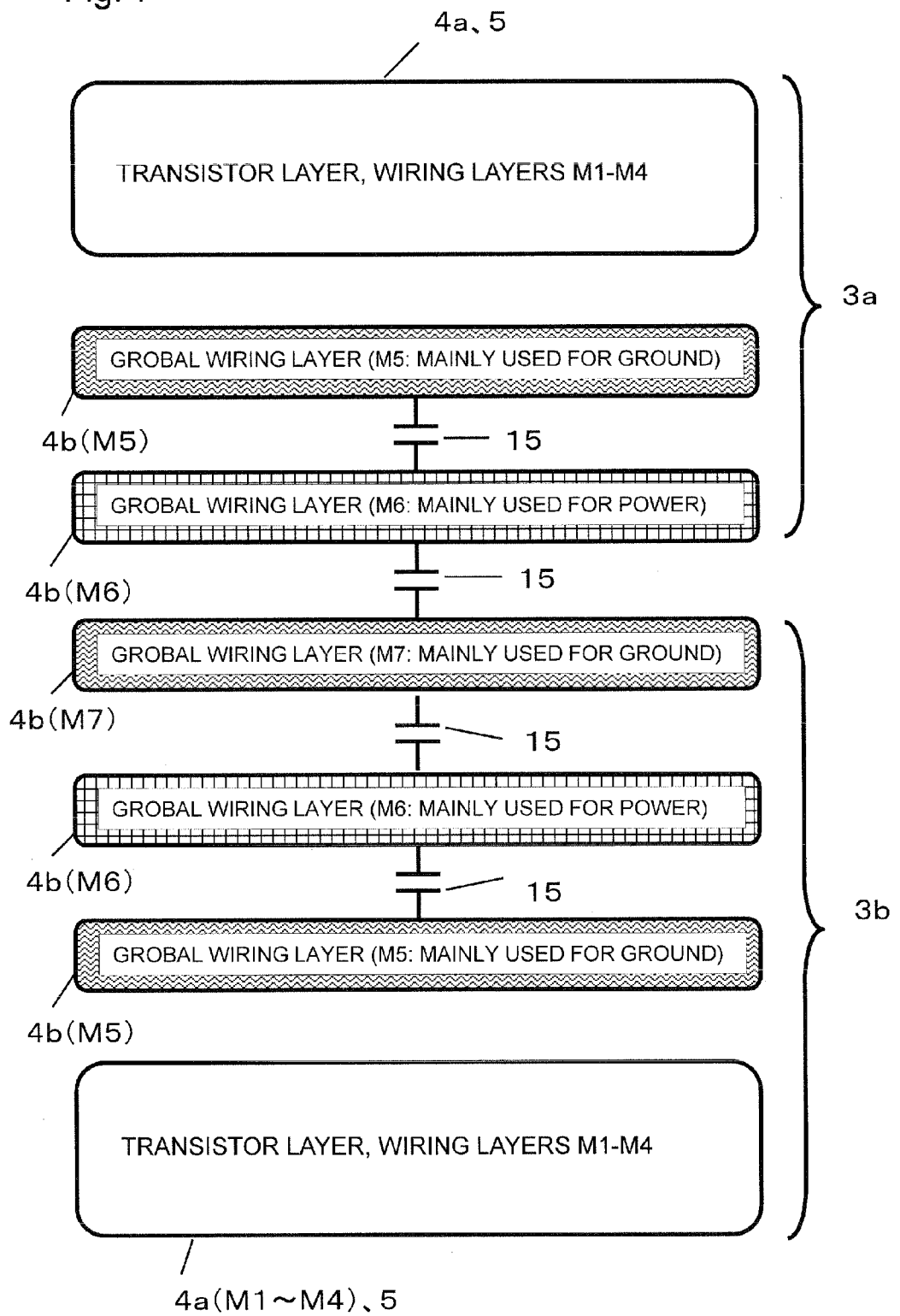
FIG. 7 is a schematic view illustrating a cross-sectional composition of a three-dimensional integrated circuit according to a first embodiment.

FIG. 7 is a schematic view illustrating a cross-sectional composition of a three-dimensional integrated circuit 10 according to the first embodiment. In order to form a higher capacity near to semiconductor chips 3a and 3b, the three-dimensional integrated circuit 10 is featured in having a second ground wiring layer or a second power supply wiring layer (M7) added on the uppermost layer of either of the stacked two semiconductor chips 3a and 3b. The three-dimensional integrated circuit 10 is advantageous in that it allows the wiring layer (M7) to be added in the same manner as ordinary wiring process steps, therefore, it allows a decoupling capacitor which has a capacity near to the semiconductor chips 3a and 3b to be formed at small additional cost without requiring a specific process step and a specific part.

Figure 8A:
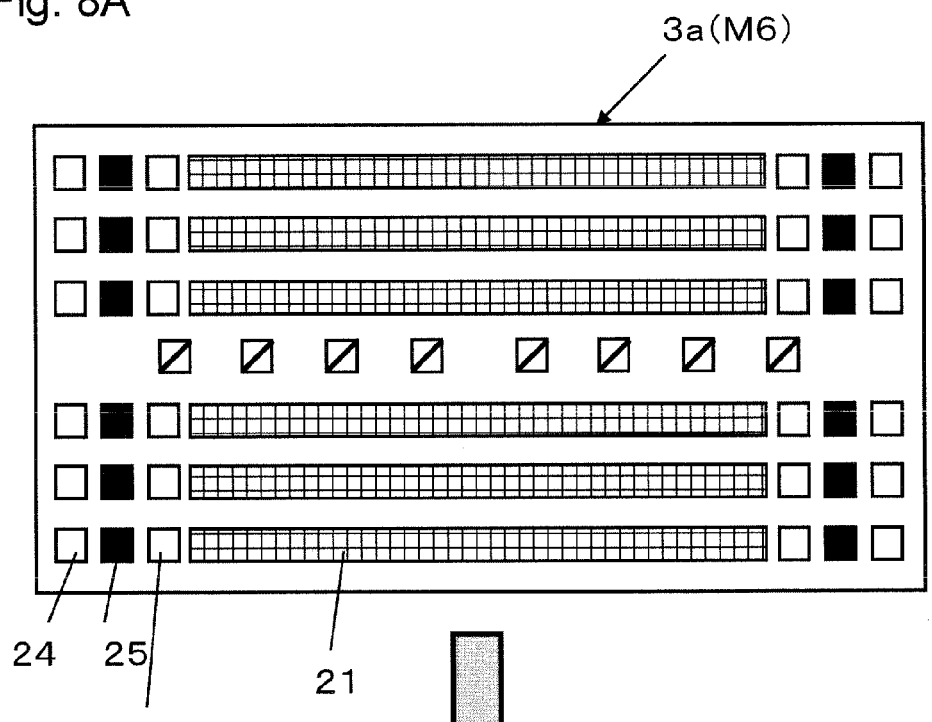
FIG. 8A is a plan view illustrating a planar layout of a chip which has a power supply wiring layer (M6)
Figure 8B:
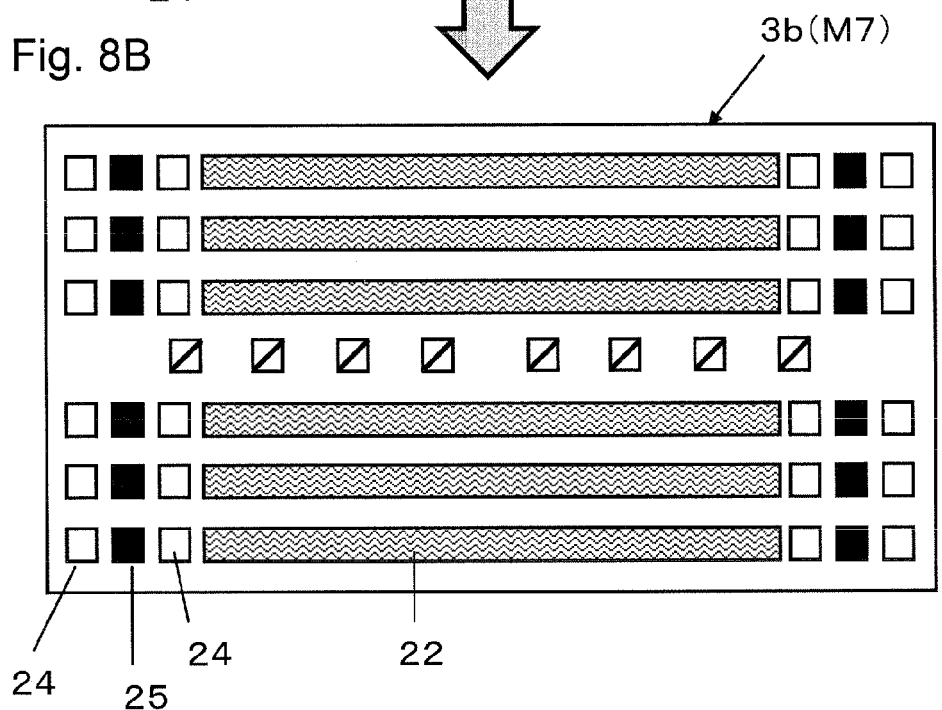
FIG. 8B is a plan view illustrating a planar layout of a chip which has a ground wiring layer (M7) newly added on a power supply wiring layer (M6)

FIG. 8A is a plan view illustrating a planar layout of a chip which has a power supply wiring layer (M6), and FIG. 8B is a plan view illustrating a planar layout of a chip which has a second ground wiring layer (M7) newly added on a power supply wiring layer (M6) of the second semiconductor chip 3b. In that case, since the three-dimensional integrated circuit 10 has the second ground wiring layer or the second power supply wiring layer (M7) newly added for three-dimensional stacking, the three-dimensional integrated circuit 10 is advantageous in that it can rewire signal lines for the three-dimensional stacking as well as for a decoupling capacity 15.

That configuration of wiring allows not only the capacities 15 between, the wiring layers in each of the semiconductor chip 3a and the semiconductor chip 3b (FIG. 8B) but also the decoupling capacitor 15 between the semiconductor chips 3a and 3b to be formed as illustrated in FIG. 7. That configuration also allows the decoupling capacitor 15 of higher capacity than that of the decoupling capacitor formed in the conventional art to be formed by adding the second ground wiring layer or the second power supply wiring layer (M7) without requiring a specific process step and a specific material. In the case where the semiconductor chips are not three-dimensionally stacked, i.e., where the semiconductor chip is used as a single semiconductor chip 3a, forming of the last layer (the second ground wiring layer or the second power supply wiring layer (M7)) only needs to be skipped, therefore, the configuration of wiring is advantageous in that it allows the semiconductor chip to be fabricated at low cost without the cost of three-dimensional integration required.

Figure 9A:
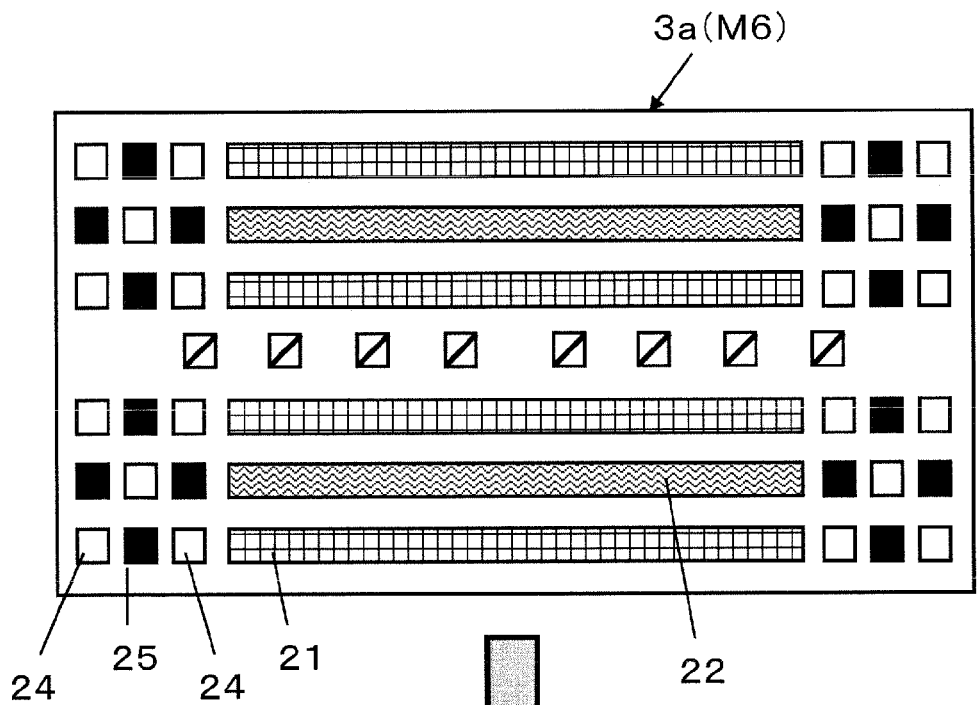
FIG. 9A is a plan view of an uppermost layer (M6) of a semiconductor chip which is wired with a power supply wiring layer and a ground wiring layer mixed.
Figure 9B:
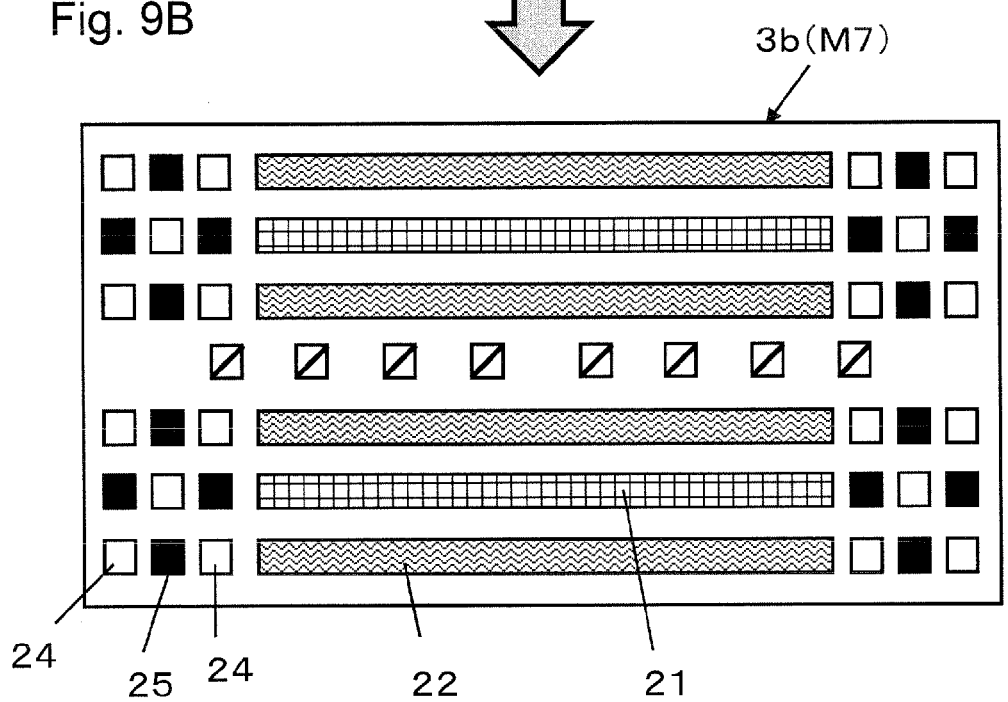
FIG. 9B is a plan view of a second ground wiring layer/power supply wiring layer (M7) which is stacked to have a polarity opposite to the polarity of the wiring layer (M6) at a position opposite to the power supply wiring layer/ground wiring layer in the original uppermost wiring layer (M6)

Although the case where the uppermost layer (M6) has nothing but the power supply wiring layer 21 which is only used for a power supply has been described in the above described example, the present disclosure is not limited to that and the wiring may be such that the power supply wiring layer 21 and the ground wiring layer 22 are mixed in the same layer (M5 or M6) as illustrated in FIG. 9A. In that case, however, as illustrated in FIG. 9B, the second ground wiring layer 22/power supply wiring layer 21 as the wiring layer (M7) to be added is stacked to have a polarity opposite to the polarity of the original uppermost wiring layer (M6) at a position opposite to the power supply wiring layer 21/ground wiring layer 22 in the wiring layer (M6).

<Configuration of a Three-Dimensional Integrated Circuit with Three or More Semiconductor Chips Stacked>

Figure 10A:
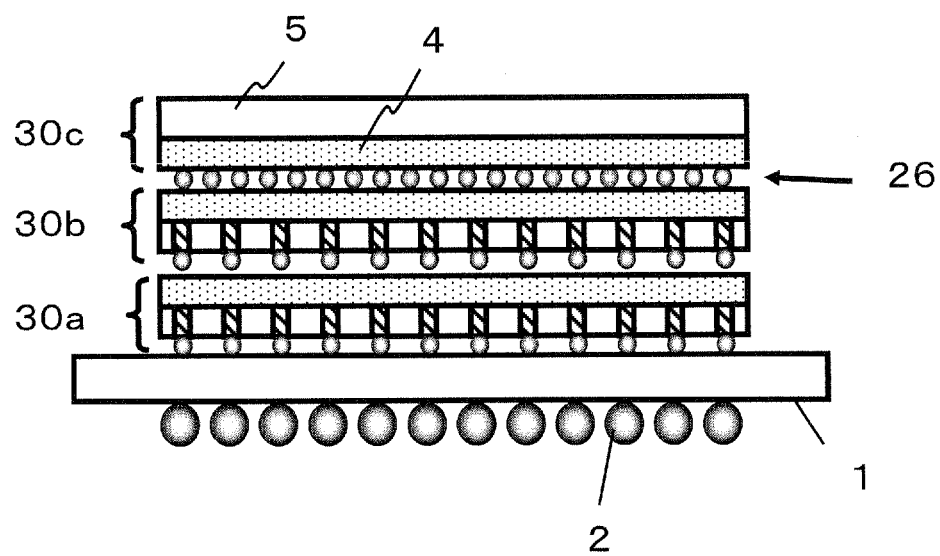
FIG. 10A is a cross-sectional view illustrating a cross-sectional composition of a three-dimensional integrated circuit which has three processors stacked.

FIG. 10A is a cross-sectional view illustrating a cross-sectional composition of a three-dimensional integrated circuit which has three processors 30a, 30b, and 30c stacked as semiconductor chips 3. In the three-dimensional integrated circuit 10 which has the three or more semiconductor chips 30a, 30b, and 30c stacked like that, a second ground wiring layer or a second power supply wiring layer is stacked by taking account of physical relationship between the decoupling capacitor and the semiconductor chip which consumes a large amount power on the board (not shown). For example, in the case where all of the semiconductor chips 30a, 30b, and 30c have the same configuration as illustrated in FIG. 10A or have the same power consumption, the two semiconductor chips 30b and 30c which are far from the board are connected face-to-face as a pair 26. On the other hand, the chips 30a and 30b which are on the board side are connected face-to-back. According to the configuration, a capacity of the decoupling capacitor can be formed near to the semiconductor chips 3b and 3c even though the semiconductor chips 3b and 3c are arranged far from the decoupling capacitor on the board, therefore, the stability of the power supply can be improved.

Figure 10B:
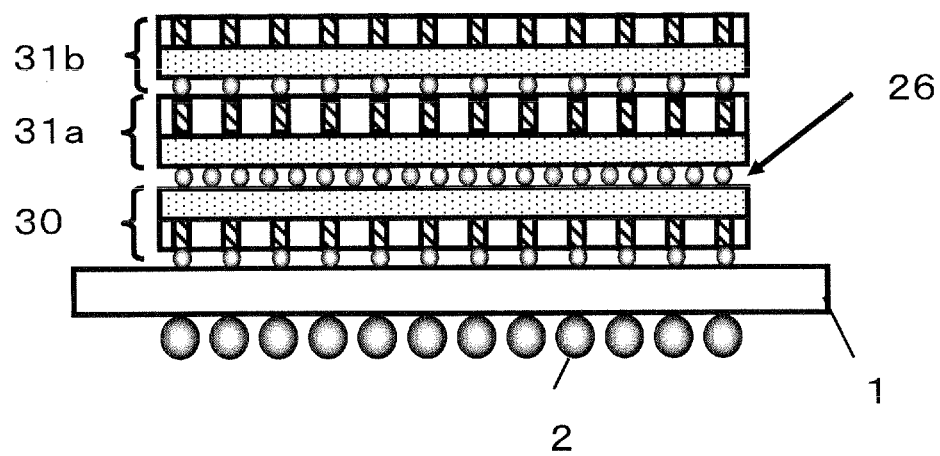
FIG. 10B is a cross-sectional view of a cross-sectional composition of a three-dimensional integrated circuit which has a processor, a memory 1, and a memory 2 stacked in the order from a board.

FIG. 10B is a cross-sectional view of a cross-sectional composition of a three-dimensional integrated circuit which has a processor 30, a memory 1 (31a), and a memory 2 (31b) stacked as semiconductor chips 3 in the order from a substrate 1. As illustrated in FIG. 10B, in the case where the semiconductor chip 30 which consumes a high power is provided at the place near to the decoupling capacitor on the board (not shown), i.e., at the bottom of the stack, the two semiconductor chips 30 and 31a which are near to the board are connected face-to-face as a pair 26. On the other hand, the semiconductor chips 31a and 31b on the top side are connected face-to-back. According to this configuration, the decoupling capacitor can be formed directly above a semiconductor chip which consumes a high current such as a processor, therefore, even in the case where the processor suddenly consumes a high volume of current, the voltage fluctuation on the memory side can be allowed.

Although the configuration of the three-dimensional integrated circuit with three wiring layers stacked has been described in this embodiment, even the three-dimensional integrated circuit with four or more wiring layers stacked may be configured in the same rule.

<Fabrication Method of the Semiconductor Chip>

A fabrication method of the semiconductor chip 3 in the present disclosure will be described with reference to FIGS. 11 to 13.

Figure 11:
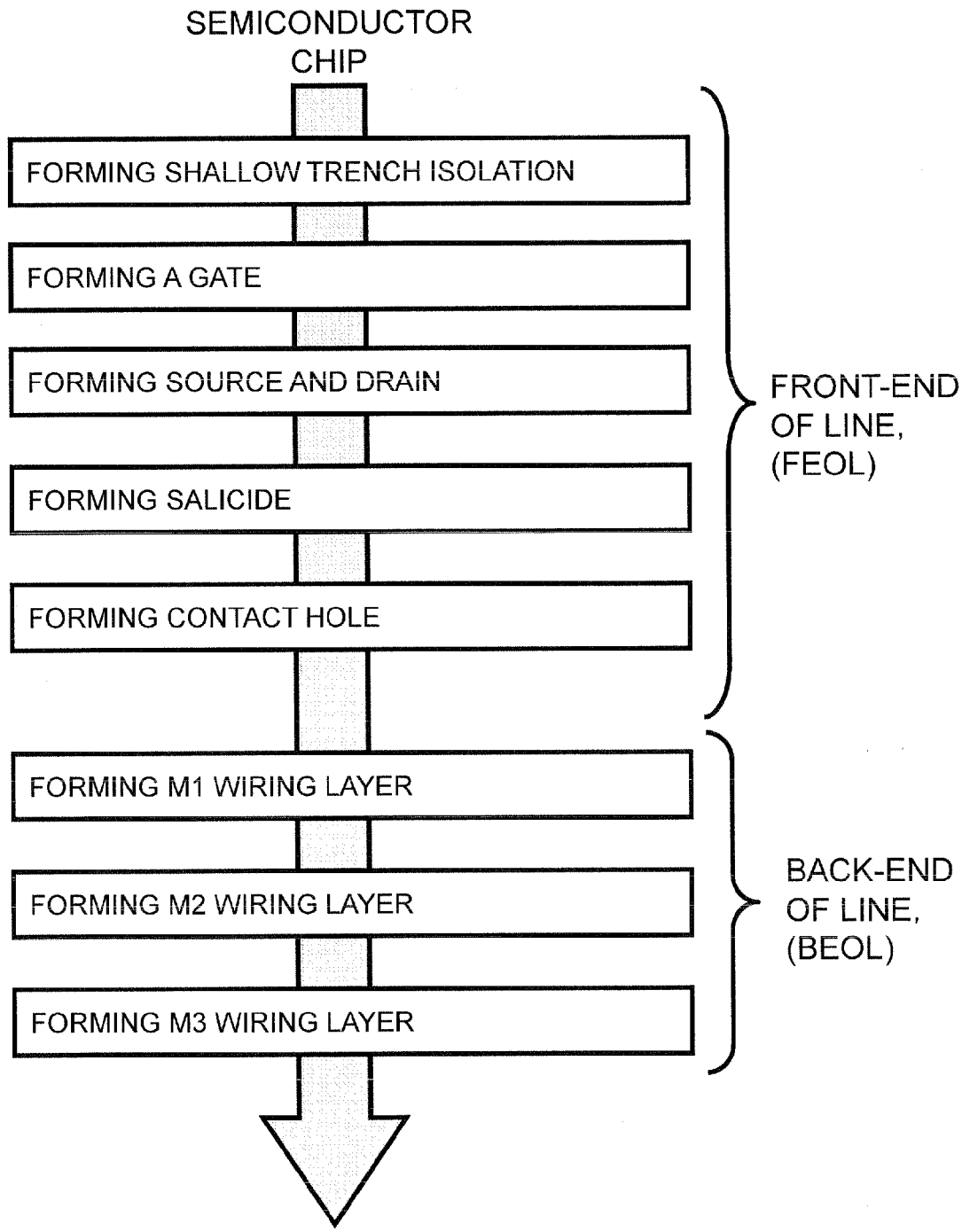
FIG. 11 is a diagram illustrating an outline of a fabrication flow of a semiconductor chip.

FIG. 11 is a diagram illustrating an outline of a fabrication flow of a semiconductor chip. Here, it is assumed that three wiring layers are configured. FIGS. 12 and 13 are for describing an outline of each process step of the fabrication flow.

Process steps for forming a semiconductor chip (integrated circuit) can be largely divided into a Front-End Of Line (FEOL) and a Back-End Of Line (BEOL).

Figure 12A:
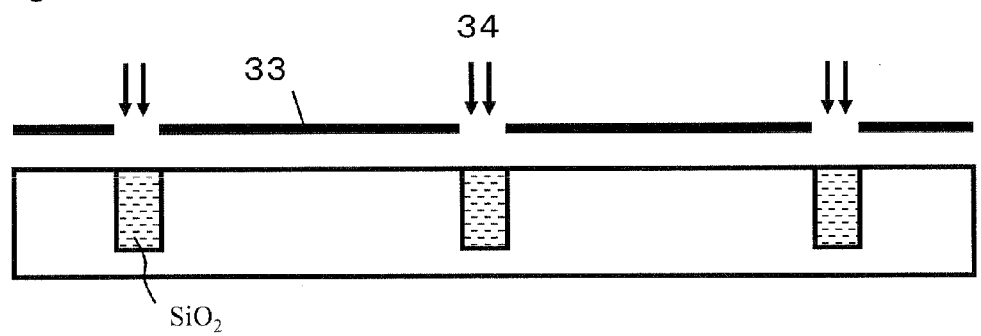
FIG. 12A is a schematic view illustrating a process step of forming a shallow trench isolation.

(1) First, shallow trench isolations are formed on a silicon wafer in the beginning (FIG. 12A). In this process, the regions other than the shallow trench isolations are masked by photoresist 33. Then, an etching process is performed in the longitudinal direction by Reactive Ion Etching (RIE) 34, so that trench type vias are formed. $SiO_2$ (32) is filled in the shallow trench isolations and the surface of the silicon wafer is polished and planarized by CMP (Chemical Mechanical Polish).

Figure 12B:
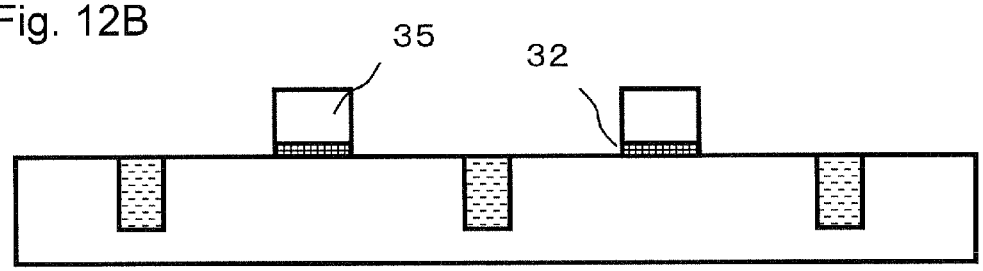
FIG. 12B is a schematic view illustrating a process step of forming a gate.

(2) Then, a thin gate oxide film is formed by thermal oxidation on the surface of the silicon substrate, and polysilicon 35 is deposited on the thin gate oxide film by LPCVD (Low Pressure CVD), so that gates are formed (FIG. 12B).

Figure 12C:
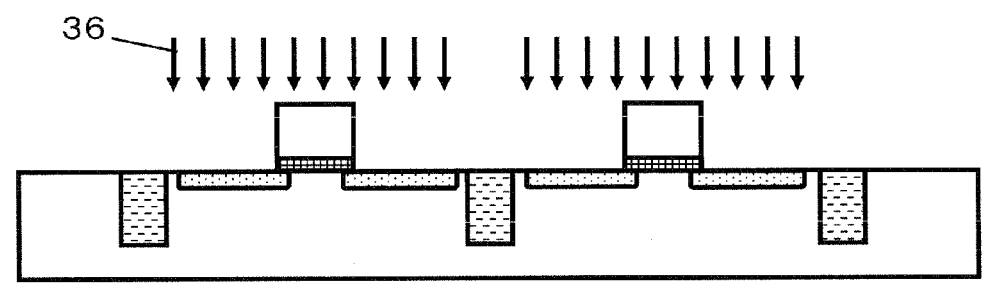
FIG. 12C is a schematic view illustrating a process step of forming diffusion regions such as a source and a drain.

(3) By using the gates as masks, dopants 36 such as boron or phosphorus are doped in the silicon substrate, so that diffusion regions such as sources and drains are formed (FIG. 12C).

Figure 13A:
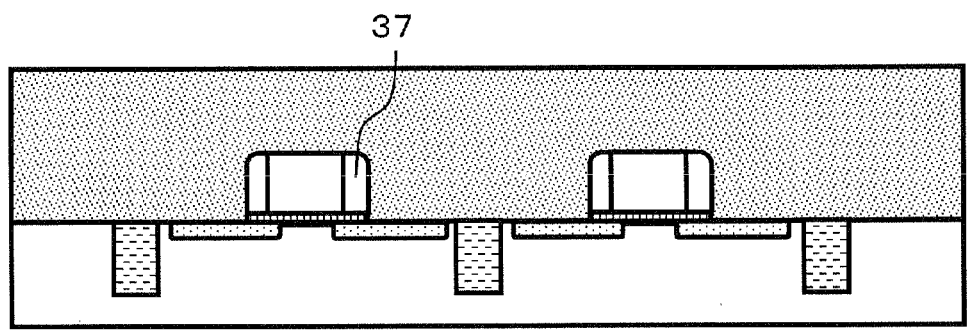
FIG. 13A is a schematic view illustrating a process step of forming salicides.

(4) Further, $Si_3N_4$ (37) is deposited as spacers by the LPCVD, and then, gaps between transistors 101 and metal lines are filled with insulating films, so that salicides are formed (FIG. 13A).

Figure 13B:
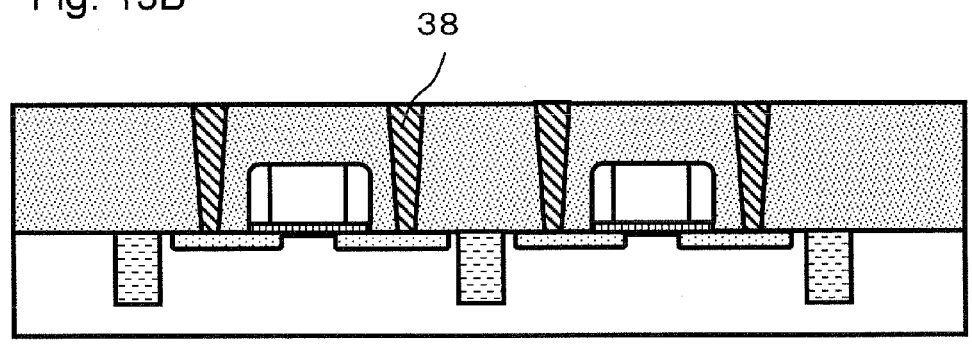
FIG. 13B is a schematic view illustrating a process step of forming a contact hole.

(5) As a final step of FEOL, contact holes are formed to the diffusion regions of the transistor and filled with aluminum or tungsten plugs 38 (FIG. 13B).

The process steps hereafter are the Back-End Of Line (BEOL) process steps.

Figure 13C:
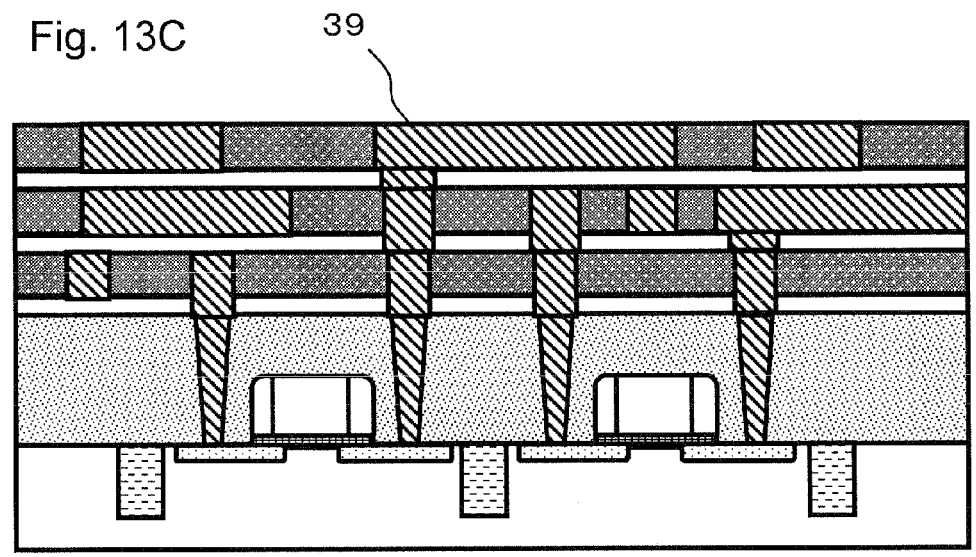
FIG. 13C is a schematic view illustrating a process step of forming each wiring layer.

(6) In order to form wiring, the regions for the wiring are masked by photoresists, then, an etching process is performed to the diffusion regions by the RIE and the traces are filled with a barrier metal, metal materials 39, and the like by CVD, plating is applied, and finally, the surface is planarized by the CMP. Subsequently, the CMP and etching are repeated in the similar manner to form multilayer wiring layers (FIG. 13C). Since the semiconductor chip has three metal wiring layers in the example of the figure, the above described processes are repeated for three times. For the metal materials, aluminum and copper may be used.

<Fabrication Method of the Three-Dimensional Integrated Circuit>

Now, a fabrication method of the three-dimensional integrated circuit according to the first embodiment of the present disclosure will be described.

Figure 14:
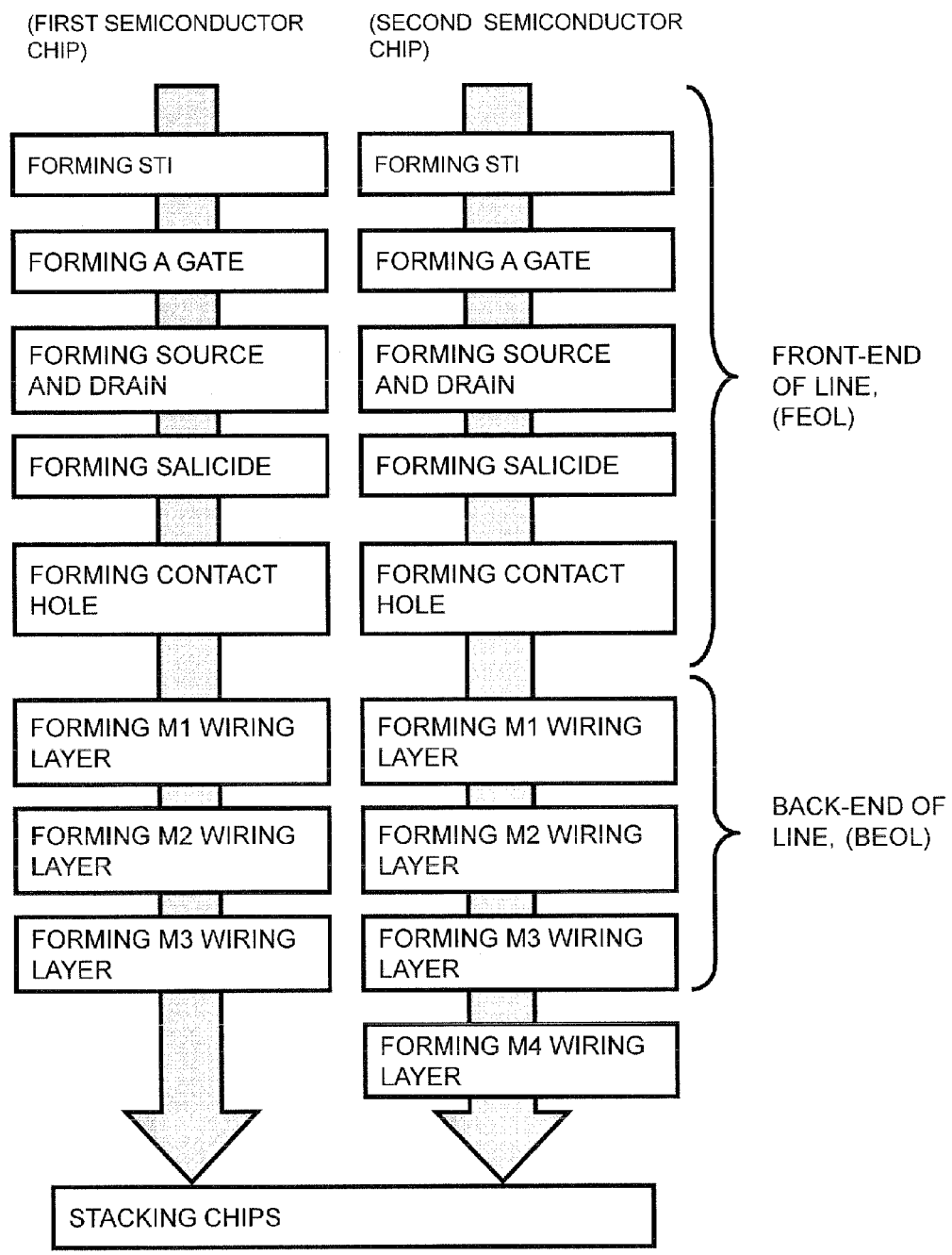
FIG. 14 is a diagram illustrating a fabrication flow in a fabrication method of the three-dimensional integrated circuit according to the first embodiment of the present disclosure in a case where different chips are bonded.

FIG. 14 is a fabrication flow in a fabrication method of the three-dimensional integrated circuit according to the first embodiment of the present disclosure in a case where different chips are bonded. Difference between the fabrication flow of the three-dimensional integrated circuit of FIG. 14 and the fabrication flow of the single semiconductor chip of FIG. 11 will be described. Basic process flow of the fabrication flow of FIG. 14 is substantially the same as that shown in FIGS. 11 to 13, however, since the three-dimensional integrated circuit has two semiconductor chips 3a and 3b stacked, the semiconductor chips 3a and 3b are fabricated with two sets of masks in separate process flows. Since details of the respective process flows are the same as those of the above described process flow, description of them will be omitted.

Figure 15:
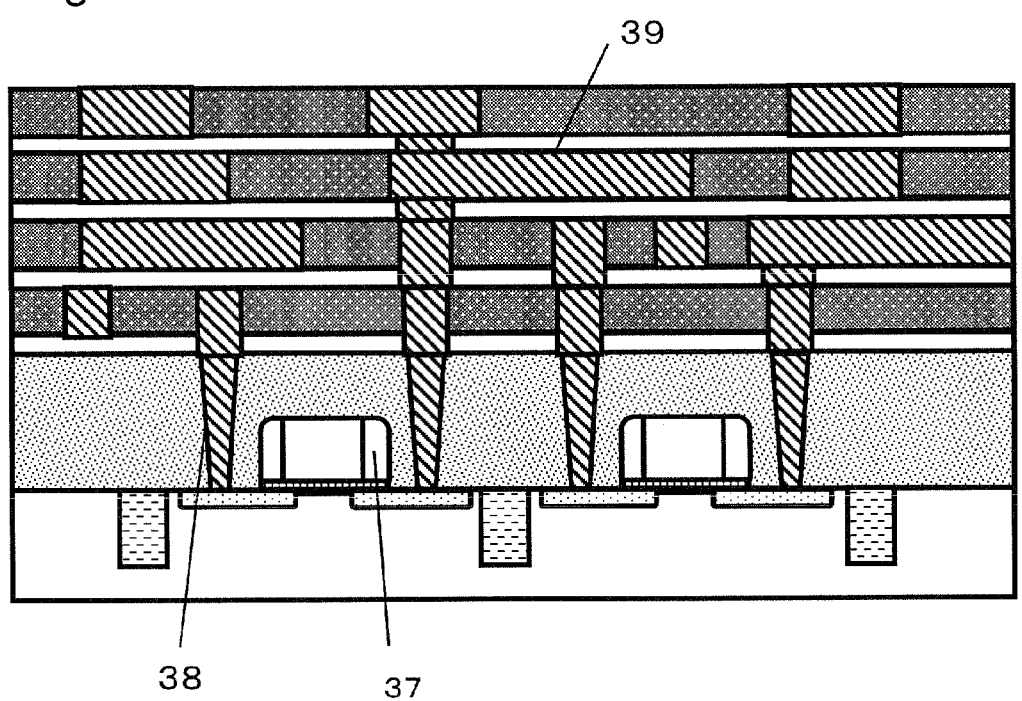
FIG. 15 is a cross-sectional view illustrating a cross-sectional composition of a second semiconductor chip which has an M4 wiring layer.
Figure 16:
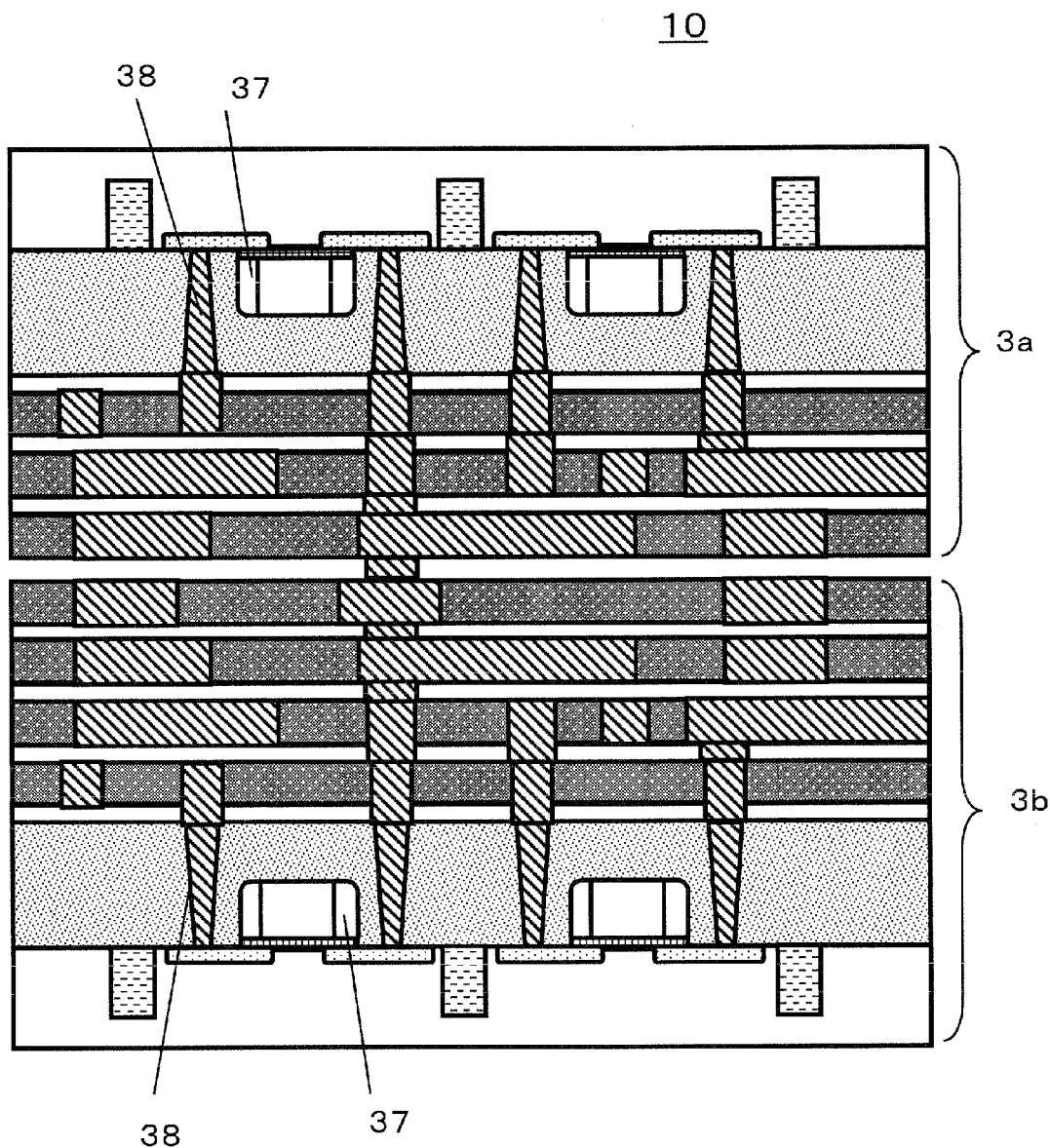
FIG. 16 is a cross-sectional view illustrating a cross-sectional structure of the three-dimensional integrated circuit.

In order to add a metal wiring layer (M4 layer in this example) to either of the two semiconductor chips 3a and 3b to be stacked, the process steps of the semiconductor chip 3b, as one of the semiconductor chips to which the metal wiring layer is to be added, increases by one process step of a wiring forming process step. As a result, the M4 wiring which has one wiring layer more than the M4 wiring of the other semiconductor chip 3a can be formed only in the semiconductor chip 3b, which is one of the semiconductor chips to be bonded (FIG. 15). Finally, these two semiconductor chips are stacked and the three-dimensional integrated circuit 10 is formed (FIG. 16).

Figure 17:
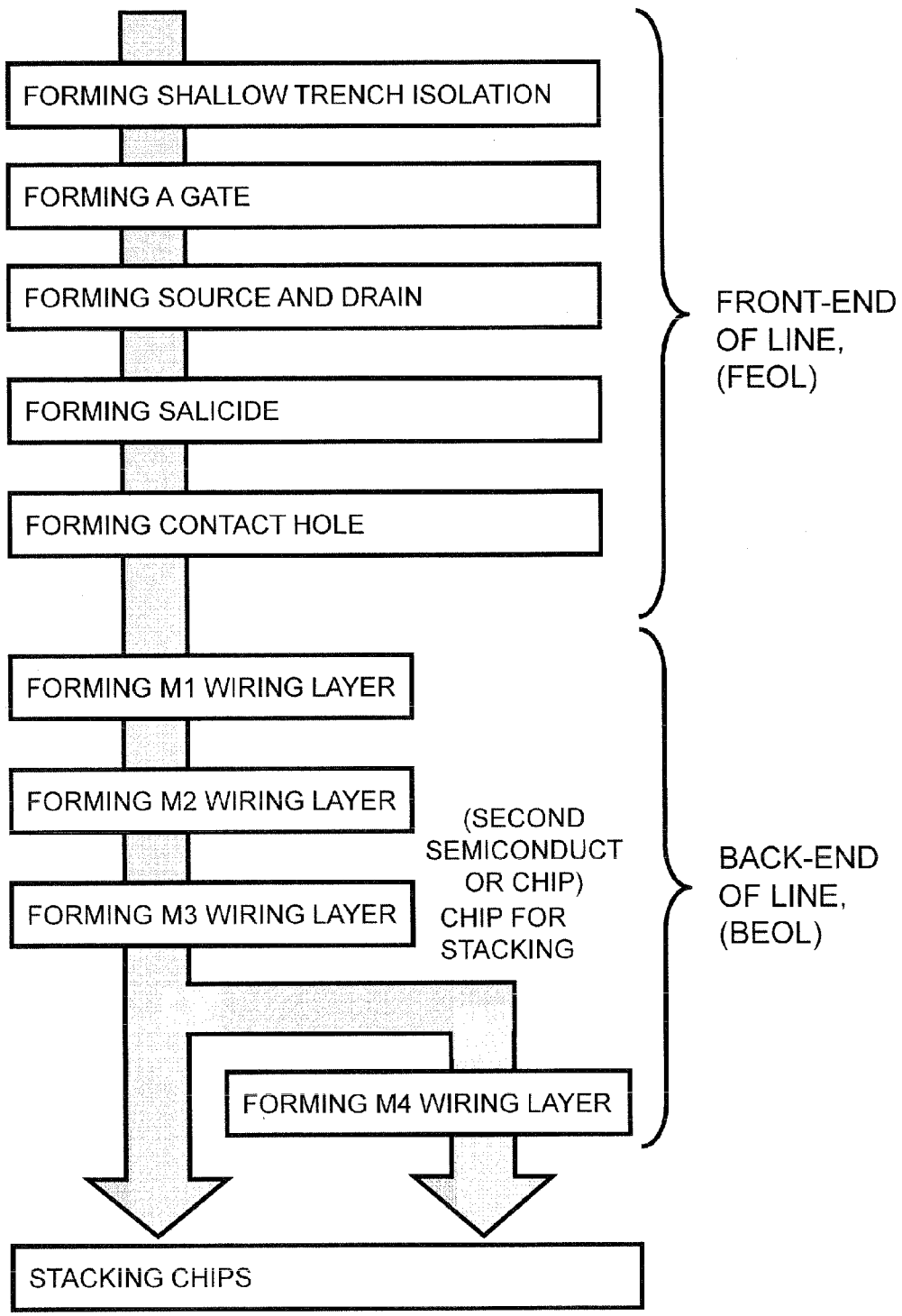
FIG. 17 is a diagram illustrating a fabrication flow of two semiconductor chips which have identical transistor layers to be used in the three-dimensional integrated circuit.

FIG. 17 is a fabrication flow of two semiconductor chips which have identical transistor layers to be used in the three-dimensional integrated circuit. In the case where semiconductor chips have identical transistor layers as those of FIG. 17, the semiconductor chips can be fabricated by sharing most of the masks and the entire fabrication process steps. In that case, even though only the final M4 wiring forming part is the different process steps for the second semiconductor chip 3b, the two semiconductor chips can be fabricated by using most of the devices and flow, therefore, the cost is reduced and the yield can be improved.

The three-dimensional integrated circuit according to the present disclosure is provided with a second ground wiring layer or a second power supply wiring layer between the two semiconductor chips. According to the configuration, the three-dimensional integrated circuit is useful as a three-dimensional integrated circuit which has improved power supply stability, since the three-dimensional integrated circuit allows not only the decoupling capacitors between the power supply wiring layers and the ground wiring layers in the respective semiconductor chips in the three-dimensional integrated circuit but also a decoupling capacitor between the two semiconductor chips to be formed.

DESCRIPTION OF REFERENCE SIGNS 1 package substrate
2 bump (provided for board)
3 chip
3a first chip
3b second chip
4 wiring layer
4a intermediate wiring layer
4b global wiring layer
5 transistor layer
6 bump (provided between chips)
10 three-dimensional integrated circuit
11 IO pad
12 power supply ring (metal wiring)
13 strap (metal wiring)
14 power supply mesh
15 decoupling capacity
21 power supply (Vdd)
22 ground (Vss)
23 pad (provided for data communication between chips)
24 pad (provided for power supply between chips)
25 pad (provided for ground contact between chips)
26 pair
30, 30a, 30b, 30c processor
31, 31a, 31b memory
32 $SiO_2$
33 photoresist
34 RIE
35 polysilicon
36 dopant
37 $Si_3N_4$
38 aluminum/tungsten plug
39 aluminum/copper
M1 local wiring layer
M2 intermediate wiring layer
M3 intermediate wiring layer
M4 intermediate wiring layer
M5 global wiring layer
M6 global wiring layer
M7 global wiring layer (added layer)

What is claimed is:

1. A three-dimensional integrated circuit comprising:
a first semiconductor chip; and
a second semiconductor chip stacked on the first semiconductor chip,
wherein the first semiconductor chip is provided with (i) a transistor layer, (ii) a first layer, which is one of a first power supply wiring layer and a first ground wiring layer, the first power supply wiring layer having a wiring pattern structure for stably supplying a power supply voltage to an internal circuit of the first semiconductor chip, and (iii) a second layer, which is the other one of the first power supply wiring layer and the first ground wiring layer,
wherein the first layer of the first semiconductor chip is located between (i) the transistor layer of the first semiconductor chip and (ii) the second layer of the first semiconductor chip,
wherein the second semiconductor chip is provided with (i) a transistor layer, (ii) a first layer, which is one of a second power supply wiring layer and a second ground wiring layer, the second power supply wiring layer having a wiring pattern structure for stably supplying a power supply voltage to an internal circuit of the second semiconductor chip, and (iii) a second layer, which is the other one of the second power supply wiring layer and the second ground wiring layer,
wherein the first layer of the second semiconductor chip is located between (i) the transistor layer of the second semiconductor chip and (ii) the second layer of the second semiconductor chip,
wherein the first semiconductor chip is further provided with a third layer, which is one of a third power supply wiring layer and a third ground wiring layer, the third layer of the first semiconductor chip being located (i) on a surface of the first semiconductor chip facing the second semiconductor chip and (ii) between the second layer of the first semiconductor chip and second semiconductor chip.

2. The three-dimensional integrated circuit according to claim 1, further comprising a decoupling capacitor formed by a parasitic capacitance between (i) the third layer of the first semiconductor chip and (ii) the second layer of the second semiconductor chip.

3. The three-dimensional integrated circuit according to claim 1, further comprising;

a first decoupling capacitor formed by a parasitic capacitance between (i) the first layer of the first semiconductor chip and (ii) the second layer of the first semiconductor chip; and a second decoupling capacitor formed by a parasitic capacitance between (i) the first layer of the second semiconductor chip and (ii) the second layer of the second semiconductor chip.

4. The three-dimensional integrated circuit according to claim 1, wherein the second semiconductor chip is stacked on the first semiconductor chip such that (i) the transistor layer, the first layer, the second layer, and the third layer of the first semiconductor chip face the transistor layer, the first layer, and the second layer of the second semiconductor chip and (ii) the transistor layer, the first layer, the second layer of the second semiconductor chip face the transistor layer, the first layer, the second layer, and the third layer of the first semiconductor chip.

5. The three-dimensional integrated circuit according to claim 1,
wherein the second layer the first semiconductor chip is provided immediately under the third layer of the first semiconductor chip, and
wherein the first semiconductor chip includes a decoupling capacitor formed by a parasitic capacitance between (i) the third layer of the first semiconductor chip and (ii) the second layer of the first semiconductor chip.

6. The three-dimensional integrated circuit according to claim 1, wherein the wiring pattern structure of each of the first power supply wiring layer, the second power supply wiring layer, and the third power supply wiring layer includes mesh-like metal wiring.

7. The three-dimensional integrated circuit according to claim 1, wherein the wiring pattern structure of each of the first power supply wiring layer, the second power supply wiring layer, and the third power supply wiring layer includes a power supply ring which encloses the wiring pattern structure and a strap which vertically or horizontally connects an inner surface of the power supply ring.

8. The three-dimensional integrated circuit according to claim 1, wherein the transistor layer of the first semiconductor chip and the transistor layer of the second semiconductor chip are the same.

9. The three-dimensional integrated circuit according to claim 1, wherein the first power supply wiring layer, the second power supply wiring layer, the third bower supply wiring layer, the first ground wiring layer, the second ground wiring lam and the third ground wiring layer correspond to global wiring layers.

10. The three-dimensional integrated circuit according to claim 1, further comprising a substrate supporting the whole of the three-dimensional integrated circuit.

11. The three-dimensional integrated circuit according to claim 1, further comprising a third semiconductor chip,
wherein the third semiconductor chip is stacked on one of the first semiconductor chip or the second semiconductor chip.

12. The three-dimensional integrated circuit according to claim 11, further comprising a substrate supporting the whole of the three-dimensional integrated circuit,
wherein the third semiconductor chip is provided between the substrate and the one of the first semiconductor chip or the second semiconductor chip.

13. The three-dimensional integrated circuit according to claim 11,
wherein the first semiconductor chip or the second semiconductor chip is provided to be in contact with the substrate,
wherein the third semiconductor chip is provided on one of the first semiconductor chip and the second semiconductor chip which is not in contact with the substrate, and
wherein the first semiconductor chip or the second semiconductor chip which is provided to be in contact with the substrate consumes a higher current than the third semiconductor chip.

14. A processor device which includes the three-dimensional integrated circuit according to claim 1.

15. The three-dimensional integrated circuit according to claim 1,
wherein the first layer of the first semiconductor chip is the first power supply wiring layer, and the second layer of the first semiconductor chip is the first ground wiring layer,
wherein the first layer of the second semiconductor chip is the second power supply wiring layer, and the second layer of the second semiconductor chip is the second ground wiring layer, and
wherein the second semiconductor chip is stacked on the first semiconductor chip such that (i) the transistor layer, the first layer, the second layer, and the third layer of the first semiconductor chip face the transistor layer, the first layer, and the second layer of the second semiconductor chip and (ii) the transistor layer, the first layer, the second layer of the second semiconductor chip face the transistor layer, the first layer, the second layer, and the third layer of the first semiconductor chip.

16. The three-dimensional integrated circuit according to claim 1,
wherein the first layer of the first semiconductor chip is the first ground wiring layer, and the second layer of the first semiconductor chip is the first power supply wiring layer,
wherein the first layer of the second semiconductor chip is the second ground wiring layer, and the second layer of the second semiconductor chip is the second power supply wiring layer, and
wherein the second semiconductor chip is stacked on the first semiconductor chip such that (i) the transistor layer, the first layer, the second layer, and the third layer of the first semiconductor chip face the transistor layer, the first layer, and the second layer of the second semiconductor chip and (ii) the transistor layer, the first layer, the second layer of the second semiconductor chip face the transistor layer, the first layer, the second layer, and the third layer of the first semiconductor chip.

* * * * *